US012213280B2

(12) United States Patent
North et al.

(10) Patent No.: US 12,213,280 B2
(45) Date of Patent: Jan. 28, 2025

(54) METHOD AND APPARATUS FOR A MOBILE INFORMATION HANDLING SYSTEM WITH AN ION DRAG SERIES ARRAY ENHANCED CONVECTION AIRFLOW

(71) Applicant: Dell Products, LP, Round Rock, TX (US)

(72) Inventors: Travis C. North, Cedar Park, TX (US); Qinghong He, Austin, TX (US); Enoch Chen, Wenshan District (TW)

(73) Assignee: DELL PRODUCTS LP, Round Rock, TX (US)

( * ) Notice: Subject to any disclaimer, the term of this patent is extended or adjusted under 35 U.S.C. 154(b) by 325 days.

(21) Appl. No.: 17/973,032

(22) Filed: Oct. 25, 2022

(65) Prior Publication Data

US 2024/0138100 A1    Apr. 25, 2024
US 2024/0237272 A9    Jul. 11, 2024

(51) Int. Cl.
*H05K 7/20* (2006.01)

(52) U.S. Cl.
CPC ..... *H05K 7/20172* (2013.01); *H05K 7/20145* (2013.01); *H05K 7/20409* (2013.01)

(58) Field of Classification Search
None
See application file for complete search history.

(56) References Cited

U.S. PATENT DOCUMENTS

| | | | |
|---|---|---|---|
| 7,545,640 B2 | 6/2009 | Fisher | |
| 8,057,609 B2* | 11/2011 | Kendall | H01M 8/0675 149/108.4 |
| 8,508,908 B2 | 8/2013 | Jewell-Larsen | |
| 9,172,101 B2* | 10/2015 | Rich | H01M 8/04201 |
| 9,679,827 B2* | 6/2017 | Vishkin | H01L 23/473 |
| 10,383,253 B1* | 8/2019 | Mujcinovic | H05K 7/20409 |
| 2004/0258970 A1* | 12/2004 | McLean | H01M 8/1007 29/890.03 |

(Continued)

FOREIGN PATENT DOCUMENTS

| | | |
|---|---|---|
| WO | 2007/112763 A1 | 10/2007 |
| WO | 2009/131980 A2 | 10/2009 |

(Continued)

*Primary Examiner* — Xanthia C Relford
(74) *Attorney, Agent, or Firm* — Prol Intellectual Property Law, PLLC; H. Kenneth Prol

(57) ABSTRACT

An information handling system comprising a hardware processor, a display device, and a memory device that includes a stacked ion emitter/collector blower cooling system with a first ion emitter/collector blower having a first ion emitter and a first ion collector and a second ion emitter/collector blower with a second ion emitter and a second ion collector, where the second ion emitter/collector blower is placed at a location within the chassis of the information handling system vertically higher than the first ion emitter/collector blower. The first ion emitter/collector blower and second ion emitter/collector blower include an ionic driving circuit operatively coupled to the first ion emitter and the second ion emitter via a high voltage to ionize gases within the first ion emitter/collector blower and second ion emitter/collector blower to create charged ions that generate a stacked emitter airflow to cool the chassis of the information handling system.

20 Claims, 7 Drawing Sheets

(56) References Cited

U.S. PATENT DOCUMENTS

| | | |
|---|---|---|
| 2005/0214180 A1 | 9/2005 | Joannou |
| 2010/0037886 A1 | 2/2010 | Krichafovitch |
| 2010/0051709 A1 | 3/2010 | Krichafovitch |
| 2011/0036552 A1 | 2/2011 | Lu |
| 2011/0261499 A1 | 10/2011 | Hizer |
| 2012/0007742 A1 | 1/2012 | Gooch |
| 2012/0008248 A1 | 1/2012 | Sawyer |
| 2012/0057356 A1 | 3/2012 | Hizer |
| 2012/0268857 A1* | 10/2012 | Jewell-Larsen ......... G06F 1/203 |
| | | 361/231 |
| 2013/0021715 A1 | 1/2013 | Jewell-Larsen |
| 2014/0372772 A1* | 12/2014 | McKnight ........... H01M 8/2432 |
| | | 713/300 |
| 2016/0265856 A1* | 9/2016 | Saveliev ................. F28F 13/16 |
| 2020/0192430 A1* | 6/2020 | McKittrick ............... H02J 7/04 |
| 2021/0096604 A1* | 4/2021 | Curran ................... G02B 5/223 |
| 2021/0166991 A1* | 6/2021 | Liu .................... G02B 6/12002 |
| 2022/0081602 A1* | 3/2022 | Kodama ................... G06F 1/20 |
| 2022/0293882 A1* | 9/2022 | Vishakantaiah ... H10K 59/8794 |
| 2022/0295655 A1* | 9/2022 | Zhu ....................... F28F 21/089 |
| 2022/0295657 A1* | 9/2022 | Zapata ................... H02K 7/145 |
| 2024/0134426 A1* | 4/2024 | He .......................... G06F 1/203 |

FOREIGN PATENT DOCUMENTS

| | | |
|---|---|---|
| WO | 2011/149667 A1 | 12/2011 |
| WO | 2012/006361 A2 | 1/2012 |

* cited by examiner

METHOD AND APPARATUS FOR A MOBILE INFORMATION HANDLING SYSTEM WITH AN ION DRAG SERIES ARRAY ENHANCED CONVECTION AIRFLOW

FIELD OF THE DISCLOSURE

The present disclosure generally relates to cooling systems for information handling system. The present disclosure more specifically relates to a stacked ion emitter/collector blower cooling system used to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Under various operating conditions, especially high-performance conditions, information handling systems may generate heat which, if not mitigated, may affect performance. The information handling system may thus include a cooling system used to cool hardware therein such as a hardware processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
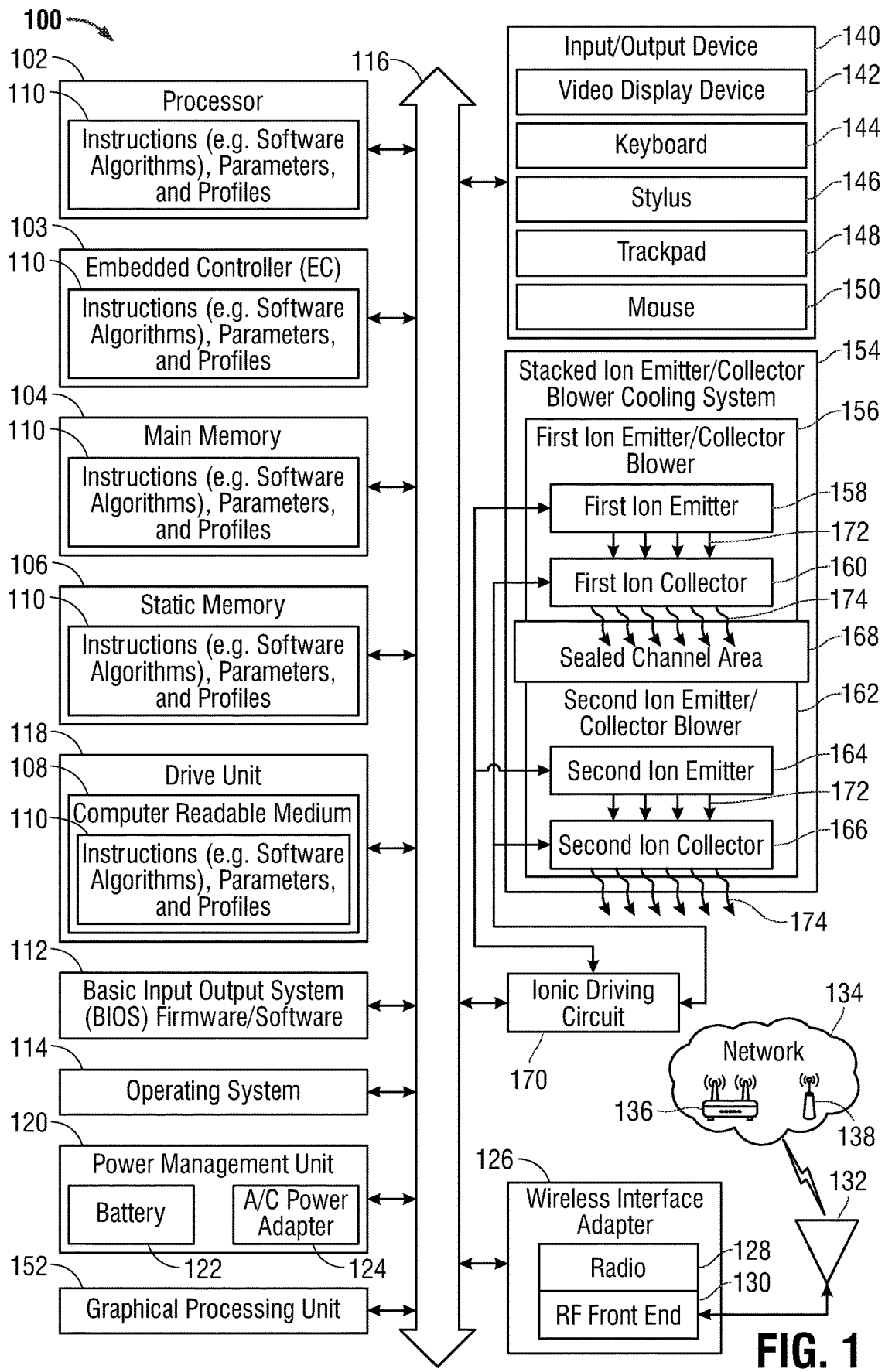
FIG. 1 is a block diagram of an information handling system including a stacked ion emitter/collector blower cooling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan used to blow heat from within the housing to a vent to vent the heated air from within the housing. However, these fans may create a higher degree of noise that may interfere with the use of the information handling system especially when the fan speed is increased due to increased power consumption and a resulting increase in temperature within the housing.

The present specification describes an information handling system that includes processor, a memory device, and a power management unit (PMU) to provide power to the processor and memory device. The information handling system further includes an stacked ion emitter/collector blower cooling system including a first ion emitter/collector blower, the first ion emitter/collector blower including a first ion emitter and first ion collector housed within a first ion emitter/collector blower housing, the first ion emitter/collector blower being placed at a location within a chassis of the information handling system vertically lower than the hardware processor in the chassis and a second ion emitter/collector blower. The second ion emitter/collector blower includes a second ion emitter and second ion collector housed within a second ion emitter/collector blower housing, the second ion emitter/collector blower being placed at a location within the chassis of the information handling system vertically higher than the hardware processor in the chassis. The first ion emitter/collector blower and second ion emitter/collector blower are in fluid communication. This stacked ion emitter/collector blower cooling system may include an ionic driving circuit operatively coupled to the first ion emitter and second ion emitter via a high voltage to ionize gases within the first ion emitter/collector blower housing and second ion emitter/collector blower housing to create charged ions that generate an airflow along a voltage field to and through the first ion collector and second ion collector respectively in each of the stacked ion emitter/collector blowers. An air inlet vent is located below the first ion emitter and formed in a back surface of the chassis of the information handling system and an air exhaust vent located at an upper exhaust vent location above the second ion collector within the chassis of the information handling system in some embodiments so that the airflow is brought into the chassis of the information handling system via the first ion emitter/collector blower housing, through the second ion emitter/collector blower housing and out of the air exhaust vent. In such an embodiment, a location of the air inlet vent relative to the upper exhaust vent location of the air exhaust vent in the chassis of the information handling system in a vertical orientation provides additional convection-enhanced airflow.

In an embodiment, the first ion collector and second ion collector are formed at external openings of their respective ion emitter/collector blower housings to provide a deionization source for the ionized gases formed by the first ion emitter and second ion emitter. The first ion collector and second ion collector may each include one or more separated blades through which the airflow may pass. The separated blades of the first ion collector and second ion collector may operate as thermal fins to dissipate heat conducted from a passive heat conducting device. These blades, in an embodiment, may be operatively coupled to a passive heat conducting device so that heat form heat-generating hardware components within the housing of the information handling system may be conducted into the separated blades. As the airflow passes the separated blades, the heat may be passed out of the housing of the information handling system via convection from the blades to the airflow from the stacked ion emitter/collector blower cooling system.

In an embodiment, the first ion emitter and second ion emitter each include a plurality of blades operatively coupled to the ionic driving circuit with the ionic driving circuit including a high-voltage electrical source to strip electrons from gas molecules via the high voltage at edges of the blades of the first ion emitter and second ion emitter. The ionic driving circuit causes electrons to be stripped from gas molecules located at edges of the plurality of emitter blades to ionize gases within the first ion emitter/collector blower and second ion emitter/collector blower and create charged ions (e.g., cations) to create an airflow within the first ion emitter/collector blower, out from the first ion emitter/collector blower, towards the second ion emitter/collector blower and out of the exhaust vent. The first ion collector and second ion collector may attract those ions created by the first ion emitter and second ion emitter thereby generating airflow by a shearing, dragging, or pulling force of the ions on surrounding air due to the electro-magnetic attraction at the first ion collector and second ion collector. This movement of the created ions by the emitter blades of the first ion emitter/collector blower and further enhanced by the second ion emitter/collector blower produces a dragging or shearing force of the surrounding air to generate the airflow from the first ion emitter and second ion emitter to the first ion collector and second ion collector, respectively, in an embodiment. This reduces the noise created by the movement of any fan blades used in the information handling system by, potentially, reducing or eliminating the use of a fan or other blower to extract the heated air from within the housing of the information handling system.

FIG. 1 illustrates an information handling system 100 similar to information handling systems according to several aspects of the present disclosure that is operatively couplable to a stacked ion emitter/collector blower cooling system 154 formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a two-in-one computer, a tablet, a smartphone, a communications device, an access point (AP), a base station transceiver, a wireless telephone, a control system, a camera, a scanner, a printer, a personal trusted device, a web appliance, or any other suitable machine capable of executing a set of machine-readable code instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of machine-readable code instructions (sequential or otherwise) via one or more hardware processing resources that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of hardware systems or sub-systems that individually or jointly execute a set, or multiple sets, of machine-readable code instructions to perform one or more computer functions.

The information handling system 100 may include memory (volatile (e.g., random-access memory, etc.), nonvolatile (read-only memory, flash memory etc.) or any combination thereof), one or more hardware processing resources, such as a central processing unit (CPU), a graphics processing unit (GPU) 152, hardware processing device, hardware controller, or any combination thereof. Additional components of the information handling system 100 can include one or more storage devices, one or more communications ports for communicating with external devices, as well as various input and output (110) devices 140, such as a keyboard 144, a mouse 150, a video display device 142, a stylus 146, a trackpad 148, or any combination thereof. The information handling system 100 can also include one or more buses 116 operable to transmit data communications between the various hardware components described herein. Portions of an information handling system 100 may themselves be considered information handling systems and some or all of which may be wireless.

Information handling system 100 can include devices or modules that embody one or more of the hardware devices or hardware processing resources to execute machine-readable code instructions for the one or more systems and modules described above, and operates to perform one or more of the methods described herein. For example, machine-readable code instructions may be executed by a PMU controller or other hardware processing resource for a stacked ion emitter/collector blower cooling system 154 to control the stacked ion emitter/collector blower cooling system 154 of embodiments herein. The information handling system 100 may execute machine-readable code instructions 110 via hardware processing resources that may operate on servers or systems, remote data centers, or on-box in individual client information handling systems according to various embodiments herein. In some embodiments, it is understood any or all portions of machine-readable code instructions 110 may operate on hardware processing resources on a plurality of information handling systems 100.

The information handling system 100 may include hardware processing resources such as a processor 102, a central processing unit (CPU), accelerated processing unit (APU), a neural processing unit (NPU), a vision processing unit (VPU), an embedded controller 103 (EC), a digital signal processor (DSP), a GPU 152, an embedded controller 103 (EC), a microcontroller, or any other type of hardware processing device that executes machine-readable code instructions to perform the processes described herein. Any of the hardware processing resources may operate to execute code that is either firmware or software code. Moreover, the information handling system 100 can include memory such as main memory 104, static memory 106, computer readable medium 108 storing machine-readable code instructions 110 of, in an example embodiment, an stacked ion emitter/collector blower cooling system 154 (e.g., controlled by a power management unit (PMU) controller), or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the hardware processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to a stacked ion emitter/collector blower cooling system 154. The stacked ion emitter/collector blower cooling system 154 may be coupled within a housing of the information handling system 100 in an embodiment so that heat generated by the operation of the hardware (e.g., hardware processor 102, memory devices 104, 106, PMU 120, CPU, etc.) may be directed out of the housing of the information handling system 100 via an air exhaust vent formed in the housing (e.g., at a top side surface of the housing of the information handling system 100). The stacked ion emitter/collector blower cooling system 154 may include a first ion emitter/collector blower 156 and a second ion emitter/collector blower 162 that may each include a housing used to house the components of the first ion emitter/collector blower 156 and second ion emitter/collector blower 162 described herein in an embodiment. In an alternative embodiment, the first ion emitter/collector blower 156 and second ion emitter/collector blower 162 do not include a housing and instead, those components of the stacked ion emitter/collector blower cooling system 154 are operatively coupled to the housing of the information handling system 100. For ease of discussion, the first ion emitter/collector blower 156 and second ion emitter/collector blower 162 of the stacked ion emitter/collector blower cooling system 154 will be described as including a housing which allows the stacked ion emitter/collector blower cooling system 154 to be modular and replaced if necessary.

The stacked ion emitter/collector blower cooling system 154 includes a first ion emitter 160 of the first ion emitter/collector blower 156 and a second ion emitter 164 of the second ion emitter/collector blower 162. In an embodiment, the first ion emitter 158 includes a plurality of emitter blades through which air may pass and which are used to create an airflow into, through, and out of the first ion emitter/collector blower 156. The number of blades may vary depending on an anticipated level of heat generation by the hardware components within the information handling system 100, and the shape and design of the housing of the first ion emitter/collector blower 156 or housing of the information handling system 100, among other factors. Each of the emitter blades are coupled to an electrode of a high voltage source of an ionic driving circuit 170. In an embodiment, each of the emitter blades includes a blade edge. In one embodiment, the blade edges may be made to come to a sharp point in order to facilitate the creation of more ions 172. In an embodiment, the first ion emitter 158 and the emitter blades may be made of a refractory metal such as niobium, chromium, molybdenum, tantalum, tungsten, and rhenium among others. In an embodiment, the portions of the stacked ion emitter/collector blower cooling system 154 and emitter blades may be electroplated with a refractory metal such as niobium, chromium, molybdenum, tantalum, tungsten, and rhenium among others with an interior layer of the first ion emitter 158 and emitter blades being made of a conductive material such as iron. It is appreciated that the emitter blades may be made of any alloy of metal that includes alloys of those refractory metals described herein.

Additionally, the second ion emitter 164 of the second ion emitter/collector blower 162 also includes a plurality of emitter blades through which air may pass and which are used to create an airflow into, through, and out of the second ion emitter/collector blower 162. It is appreciated that the second ion emitter/collector blower 162 is placed in series relative to the first ion emitter/collector blower 156 such that the airflow 174 emitted by the first ion emitter/collector blower 156 via operation of the first ion emitter 158, first ion collector 160, and ionic driving circuit 170 is received at the second ion emitter 164 of the second ion emitter/collector blower 162. Accordingly, the second ion emitter 164 may have similar features as those found in the first ion emitter/collector blower 156 and the first ion emitter 158. In an embodiment, the second ion emitter 164 includes a plurality of emitter blades through which air may pass and which are used to create an airflow into, through, and out of second ion emitter/collector blower 162. The number of blades may vary depending on an anticipated level of heat generation by the hardware components within the information handling system 100 and the shape and design of the housing of the second ion emitter/collector blower 162 or housing of the information handling system 100, among other factors. Each of the emitter blades are coupled to an electrode of a high voltage source of an ionic driving circuit 170. In an embodiment, each of the emitter blades includes a blade edge. In one embodiment, the blade edges may be made to come to a sharp point in order to facilitate the creation of more ions 172. In an embodiment, the second ion emitter 164 and the emitter blades may be made of a refractory metal such as niobium, chromium, molybdenum, tantalum, tungsten, and rhenium among others. In an embodiment, the portions of the stacked ion emitter/collector blower cooling system 154 and emitter blades may be electroplated with a refractory metal such as niobium, chromium, molybdenum, tantalum, tungsten, and rhenium among others with an interior layer of the second ion emitter 164 and emitter blades being made of a conductive material such as iron. It is appreciated that the emitter blades may be made of any alloy of metal that includes alloys of those refractory metals described herein.

The stacked ion emitter/collector blower cooling system 154 also includes a first ion collector 160 of a first ion emitter/collector blower 156. In an embodiment, the first ion collector 160 includes a plurality of collector blades through which air may pass and which are used to deionize those ions 172 created at the first ion emitter 158 as described herein. The number of collector blades may vary depending on an anticipated level of heat generation by the hardware components within the information handling system 100 and the shape and design of the housing of the second ion emitter/collector blower 162 or the housing of the information handling system 100, among other factors such as the creation of ions 172 at the first ion emitter 158. Each of the collector blades are coupled to an electrode of a high voltage source of an ionic driving circuit 170 in an embodiment. In an embodiment, the collector blades are coupled to a grounding source used to prevent arcing between the first ion emitter 158 and first ion collector 160. In an embodiment, each of the collector blades includes a blade edge. It is appreciated that the ion collector blades may be made of any alloy of metal that includes alloys of those refractory metals described herein.

The stacked ion emitter/collector blower cooling system 154 also includes a second ion collector 166 of a second ion emitter/collector blower 162. In an embodiment, the second ion collector 166 includes a plurality of collector blades through which air may pass and which are used to deionize those ions 172 created at the second ion emitter 164 as described herein. The number of collector blades may vary depending on an anticipated level of heat generation by the hardware components within the information handling system 100 and the shape and design of the housing of the second ion emitter/collector blower 162 or the housing of the information handling system 100, among other factors such as the creation of ions 172 at the second ion emitter 164. Each of the collector blades are coupled to an electrode of a high voltage source of an ionic driving circuit 170 in an embodiment. In an embodiment, the collector blades are coupled to a grounding source used to prevent arcing between the second ion emitter 164 and second ion collector 166. In an embodiment, each of the collector blades includes a blade edge. It is appreciated that the ion collector blades may be made of any alloy of metal that includes alloys of those refractory metals described herein.

As described herein, the first ion emitter 158 and its blades and the second ion emitter 164 and its blades as well as the first ion collector 160 and its blades and second ion collector 166 and its blades are electrically coupled to a high voltage source (e.g., 2 kV to 10 kV voltage source difference between the ion emitters 158, 164 and the ion collectors 160, 166). In an embodiment, the ionic driving circuit 170 may include a boost converter that provides, for the high voltage source of the ionic driving circuit 170, those voltages described herein to the ion emitters 158, 164 and ion collectors 160, 166.

As described in embodiments herein, the first ion emitter/collector blower 156 and second ion emitter/collector blower 162 of the stacked ion emitter/collector blower cooling system 154 may be operatively coupled to an ionic driving circuit 170. In an embodiment, the ionic driving circuit 170 is controlled via the processor 102, the PMU 120 with a hardware controller, an embodied controller, or the like. The ionic driving circuit 170, in an embodiment, includes a high voltage source that is operatively coupled to the stacked ion emitter/collector blower cooling system 154. In an embodiment, the high voltage source may include a boost converter that steps up voltage from its input (e.g., a battery 122 or A/C power adapter 124) to the output at the ion emitters 158, 164 and/or the ion collectors 160, 166 of the stacked ion emitter/collector blower cooling system 154. The high voltage source of the ionic driving circuit 170 causes the ion emitters 158, 164 to emit ions 172 from the blade edges of each emitter blade. In the context of the present specification, the term "emit", or "emitter" is meant to describe an action and device that, at its edges or other surfaces, creates ions 172 and, via an electromagnetic repulsion, repels those ions 172 towards an attracting, oppositely charged source such as the ion collectors 160, 166 described herein. In an embodiment, the high voltage source of the ionic driving circuit 170 causes electrons to be ripped away from certain molecules such as gas molecules in the atmosphere thereby creating ions 172 (e.g., positively-charged ions 172) at the edges or other surfaces of the emitter blades. This ionization process may include the removal of one or more electrons from the outer valence shells of the individual molecules within the gas such that they become positively charged (e.g., cations) in an embodiment. In an example where the interior of the first ion emitter/collector blower 156 and second ion emitter/collector blower 162 includes atmospheric air, any number of types of gas molecules may be subjected to this process. For example, where the gas includes oxygen (O), the ionization of oxygen may include the removal of a single electron or two electrons from the oxygen molecule. This may lead to a $O^+$ or $O^{2+}$ ion (e.g., cation) being created by the stacked ion emitter/collector blower cooling system 154 and ionic driving circuit 170 in an embodiment. Other gas molecules or molecules within the atmosphere within the first ion emitter/collector blower 156 and second ion emitter/collector blower 162 may similarly be ionized such as nitrogen, carbon dioxide, argon, hydrogen, etc. to create other ions 172 such as $N^{+1}$, $N^{+2}$, $N^{+3}$, $N^{+4}$, $N^{+5}$, $O_3$ (ozone), $H^{+1}$.

This ionization of the atmospheric gases within the first ion emitter/collector blower 156 and second ion emitter/collector blower 162 helps to cause an airflow 174 within the first ion emitter/collector blower 156 and second ion emitter/collector blower 162. In an embodiment, the movement of the ions 172 from the ion emitters 158, 164 to the ion collectors 160, 166 creates a shearing force on the air (e.g., ionized molecules drag non-ionized molecules) within the first ion emitter/collector blower 156 and second ion emitter/collector blower 162. This shearing force pulls the other air molecules in the direction of the magnetic pull of the ions 172 created by the ion emitters 158, 164 towards the ion collectors 160, 166 thereby creating this airflow 174. In an embodiment, the movement of the ions 172 created and emitted from the ion emitters 158, 164 may be from the ion emitters 158, 164 to the ion collectors 160, 166. In an example embodiment, the ion emitters 158, 164 may each be operatively coupled to a positive electrode of the high voltage source of the ionic driving circuit 170. As a result of generating the positively charged ions 172, the charged ion emitters 158, 164 now repel those positively charged ions 172 causing the charged ions 172 to be repelled away from the ion emitters 158, 164, following the electric field created between the ion emitters 158, 164 and ion collectors 160, 166, and attracted to the ion collectors 160, 166.

In an embodiment, the ion collectors 160, 166 are each operatively coupled to a negative or opposite electrode of the high voltage source of the ionic driving circuit 170. In an embodiment, the ion collectors 160, 166 are operatively coupled to a grounding source or high voltage negative source of the ionic driving circuit 170. Whether the ion collectors 160, 166 are coupled to a negative electrode of the high voltage source or to ground of the high voltage source, the voltage difference between the each of the ion emitters 158, 164 and their respective ion collectors 160, 166 determines an electric field between the ion emitters 158, 164 and the ion collectors 160, 166. The ions 172 created by the ion emitters 158, 164 follow this electric field. In an embodiment where the ion collectors 160, 166 are operatively coupled to a negative electrode of the high voltage source and not ground, the ion collectors 160, 166 may be electrically insulated from the remaining portions of the first ion emitter/collector blower 156 and second ion emitter/collector blower 162. In an embodiment, this electrical isolation may be accomplished by making the housings of the first ion emitter/collector blower 156 and second ion emitter/collector blower 162 out of an electrically non-conductive material such as plastic. In an embodiment, the electrical isolation may be accomplished by placing an insulative gasket between the ion collectors 160, 166 and a housing of the first ion emitter/collector blower 156 and second ion emitter/collector blower 162 and the ion emitters 158, 164. The electrical isolation of the ion collectors 160, 166 allows for the electrical field between the ion emitters 158, 164 and ion collectors 160, 166 to be formed allowing for an electrical field path for the ions 172 to follow.

In an embodiment, the creation of the electric field between the ion emitters 158, 164 and ion collectors 160, 166 causes the positively-charged ions 172 created by the ion emitters 158, 164 to be attracted to the negatively charged ion collectors 160, 166 further causing movement of the ions 172 and creating an airflow 174 within the first ion emitter/collector blower 156 and additional enhanced movement at the second ion emitter/collector blower 162 as described. As the positively-charged ions 172 reach the ion collectors 160, 166, those missing valence electrons stripped away by the ion emitters 158, 164 at the ions 172 may be added to a valence shell of the ionized molecules placing those gases at a neutral electrical charge again. Following the example of the ionization of the oxygen molecules in the atmospheric gases within the first ion emitter/collector blower 156 and second ion emitter/collector blower 162 by the ion emitters 158, 164, as these $O^+$ or $O^{2+}$ ions 172 (e.g., cations) have their extraneous electrons returned from at their valence electron shells (e.g., a single electron or two electrons, respectively) the oxygen molecules are placed in an electrically neutral state.

The creation of this airflow 174 via the ionic movement of the ions created by the ion emitters 158, 164 has a low-pressure head of around 0.04 to 0.05 inches of $H_2O$ (water column) as compared to the rotation of a fan or another type of blower that may have a pressure head of around 0.5 inches of $H_2O$. However, the flow rate of air into and out of the stacked ion emitter/collector blower cooling system 154 via operation of the ion emitters 158, 164 and ion collectors 160, 166 creating ions 172 is relatively higher than the potential flow rate of air created by a single ion emitter/collector blower. For purposes of the present specification, the term "pressure head" is defined as the height of a fluid (e.g., air, water or other fluids) column that corresponds to a particular pressure exerted by the fluid column corresponding to pressure or psi of airflow created by the ionization of air. With imparting relatively high airflow rate with lower pressure head, the stacked ion emitter/collector blower cooling system 154 may still maintain the reduced acoustics in an embodiment.

In some embodiments, the airflow 174 created by this movement of the ions 172 may supplement the airflow created via the rotation of a fan or activation of a blower. As such, in an embodiment, the rotation of the fan may be reduced in speed or stopped as compared to other fans that do not operate alongside a stacked ion emitter/collector blower cooling system 154 in other information handling systems 100. Because the movement of the ions 172 creates an airflow, in some embodiments the rotation of the fan may be stopped allowing the cooling of the hardware within the housing of the information handling system 100 by the stacked ion emitter/collector blower cooling system 154 to be accomplished via the airflow created by the creation of the ions 172 by the ion emitters 158, 164. In some embodiments where the heat of the hardware within the housing of the information handling system 100 increases, the processor 102, an embedded controller 103, or other hardware processor may direct a motor driver hardware to drive a fan motor to turn the fan so that the additional airflow created by the rotation of the fan blades may increase the velocity of the airflow further. This allows the noises associated with the rotation of the fan to be reduced or even eliminated during relatively cool temperatures within the housing of the information handling system 100 thereby decreasing the noise heard by the user of the information handling system 100. As a result, in an embodiment, the stacked ion emitter/collector blower cooling system 154 described herein may have a noiseless base capability of cooling the information handling system 100 with a backup cooling system via actuation of a fan motor to rotate the fan blades as described herein. This may further increase the user satisfaction of the information handling system 100 during operation of the information handling system 100 by decreasing fan noise heard by the user.

It is appreciated that a positive electrode of the high voltage source of the ionic driving circuit 170 may be operatively coupled to the ion collectors 160, 166 with the negative electrode of the high voltage source operatively coupled to the ion emitters 158, 164. In this example embodiment, the ion collector 160, 166 structures operating as the ion emitters may strip electrons from the gas molecules creating positively-charged ions 172 (e.g., cation) thereby operating, even temporarily, as the ion emitter. This allows the airflow 174 created by the shearing force of the created ions 172 to be reversed. In an embodiment, this may be done so that any dust or debris collecting within the first ion emitter/collector blower 156, second ion emitter/collector blower 162, or housing of the information handling system 100 may be dislodged. Because the ion emitters 158, 164 are placed vertically above an air inlet vent, any dust or debris collected via this reversed airflow may be passed out of the housing of the information handling system 100 via this air inlet vent. The ionic driving circuit 170 may, therefore, selectively reverse the operative connection of the electrodes to the ion emitters 158, 164 and ion collectors 160, 166 to change the direction of airflow as described in order to perform this internal cleaning process.

In an embodiment, the information handling system 100 is a tablet-type information handling system or a two-in-one information handling system 100. In some examples, a keyboard 144 is included with the keyboard 144 being a wireless or removeable keyboard that allows the user to use the information handling system 100 in either a tablet configuration or a laptop configuration. The information handling system 100 may be any information handling system that may be operated in an upright orientation. In an example embodiment, the hardware processor 102 such as a CPU may be placed within a display chassis instead of within the removable or wireless keyboard 144. This places the hardware processor 102 behind the video display device 142. The hardware processor 102, in an example embodiment, may be placed vertically at the same level or higher than the first ion emitter/collector blower 156 with its first ion emitter 158 and first ion collector 160. The placement of the hardware processor 102 above the first ion emitter/collector blower 156 allows for the operation of the stacked ion emitter/collector blower cooling system 154 to take advantage of a stack effect or chimney effect in some embodiments. The chimney effect, in the present specification, pulls air into the housing of the information handling system 100 via an air inlet vent and out of the housing via an air exhaust vent due to the differences in air buoyancy between the air inside the housing of the information handling system 100 and the air outside of the information handling system 100 for convection-assisted airflow. Because the air within the housing of the information handling system 100 is heated due to the operation of the heat-generating hardware components, cool air is pulled into the housing and accelerated through the housing via operation of the first ion emitter/collector blower 156 and second ion emitter/collector blower 162. This increases the amount of cold air drawn into and heated air passed out of the housing of the information handling system 100 via an added convection flow effect or chimney effect in some embodiments.

In an embodiment, a sealed channel area 168 may be formed between the first ion emitter/collector blower 156 and second ion emitter/collector blower 162. This sealed channel area 168 allows the airflow 174 output from the first ion emitter/collector blower 156 to be directed into the second ion emitter/collector blower 162 so that the operation of the second ion emitter/collector blower 162 increases the velocity of the airflow 174 through the housing of the information handling system 100. In an embodiment, the sealed area channel 168 may be a portion of the information handling system chassis that is fluidically sealed between the first ion emitter/collector blower 156 and second ion emitter/collector blower 162. In other embodiments, the sealed area channel 168 may be fluidically coupled to and sealed with those heat-generating hardware devices within the housing of the information handling system. This allows heat to be directed into the airflow 174 between the first ion emitter/collector blower 156 and second ion emitter/collector blower 162 and pulled out of the housing of the information handling system 100. In an embodiment, the sealed area channel 168 may house one or more passive heat conducting devices that draw heat away from the heat-generating devices and into an airflow 174 between the first ion emitter/collector blower 156 and second ion emitter/collector blower 162 acting as a fluid-to-fluid heat exchanger transferring thermal energy from the passive heat conducting devices (e.g., heatpipe, vapor chamber, fin-stack, etc.) to the air within the airflow 174. In an embodiment, the sealed area channel 168 may house one or more heat-generating devices as well within an airflow 174 between the first ion emitter/collector blower 156 and second ion emitter/collector blower 162 acting as a fluid-to-fluid heat exchanger transferring thermal energy from the heat generating devices as well as any passive heat conducting devices (e.g., heatpipe, vapor chamber, fin-stack, etc.) to the air within the airflow 174.

The information handling system 100 can include one or more set of machine-readable code instructions 110 that can be executed by hardware processing resources to cause the computer system to perform any one or more of the methods or computer-based functions disclosed herein. For example, machine-readable code instructions 110 may execute, via hardware processing resources, various software applications, software agents, a basic input/output system (BIOS) 112 firmware and/or software, or other aspects or components. Machine-readable code instructions 110 may execute a control system for a stacked ion emitter/collector blower cooling system 154 to control various aspects of the ion emitters 158, 164 and ion collectors 160, 166 with ionic driving circuit 170 of the embodiments herein. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of machine-readable code instructions 110 such as software can be embedded to be executed by the hardware processor 102, the embedded controller 103, or other processing devices such as a GPU 152 to perform the processes described herein. Similarly, main memory 104 and static memory 106 may also contain a computer-readable medium for storage of one or more sets of machine-readable code instructions, parameters, or profiles 110 described herein. The disk drive unit 118 or static memory 106 also contain space for data storage. Further, the machine-readable code instructions 110 may embody one or more of the methods as described herein. In a particular embodiment, the machine-readable code instructions, parameters, and profiles 110 may reside completely, or at least partially, within the main memory 104, the static memory 106, and/or within the disk drive 118 during execution by the hardware processor 102 or GPU 152 of information handling system 100. The main memory 104, GPU 152, and the hardware processor 102 also may include computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a hardware controller and executable machine-readable code instructions to manage the power provided to the components of the information handling system 100 such as the hardware processor 102, embedded controller 103, and manage control of the ion emitters 158, 164 and ion collectors 160, 166, ionic driving circuit 170, and other hardware components described herein. The PMU 120 may control power to one or more components including the one or more drive units 118, the hardware processor 102 (e.g., CPU), the GPU 152, embedded controller 103, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels or temperature via thermistors and be electrically coupled, either wired or wirelessly, to the information handling system 100 to provide this power and coupled to bus 116 to provide or receive data or machine-readable code instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed. PMU 120 may include a hardware controller to execute machine-readable code instructions 110 of a stacked ion emitter/collector blower cooling system 154 to control the ion emitters 158, 164 and ion collectors 160, 166 of the stacked ion emitter/collector blower cooling system 154 based on detected temperature thresholds according to embodiments of the present disclosure.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module can include hardware processing resources executing software, including firmware embedded at a device, such as an Intel® Core class processor, ARM® brand processors, Qualcomm® Snapdragon processors, or other processors and chipsets, or other such hardware device capable of operating a relevant software environment of the information handling system. The system, device, controller, or module can also include a combination of the foregoing examples of hardware or hardware executing software. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and controllers that are in communication with one another can communicate directly or indirectly through one or more intermediaries.

Figure 2A:
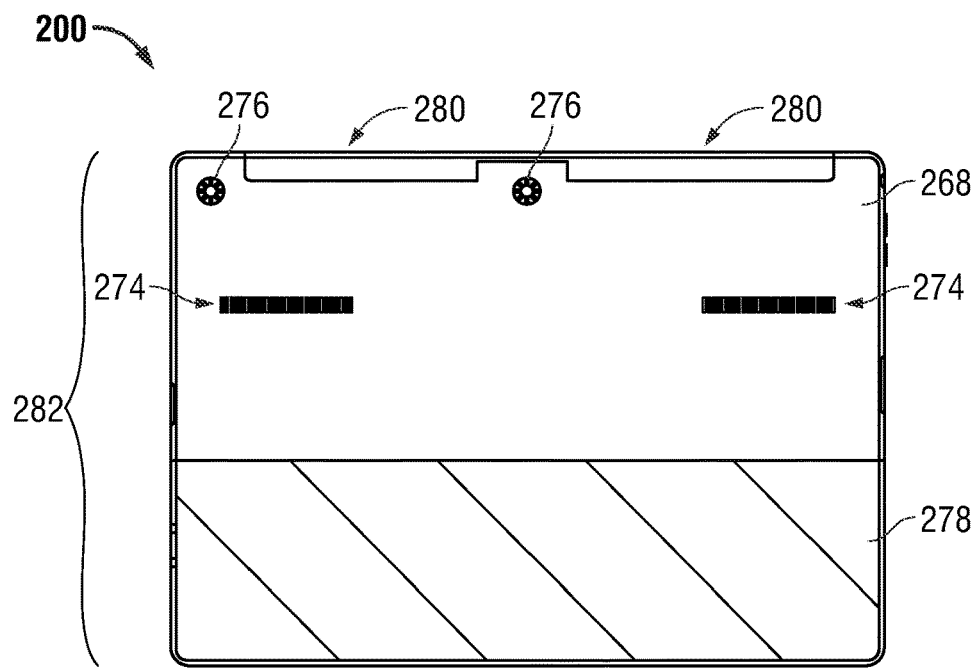
FIG. 2A is a graphic diagram rear view of an information handling system housing a stacked ion emitter/collector blower cooling system including a series array of ion emitter/collector blowers according to an embodiment of the present disclosure.
Figure 2B:
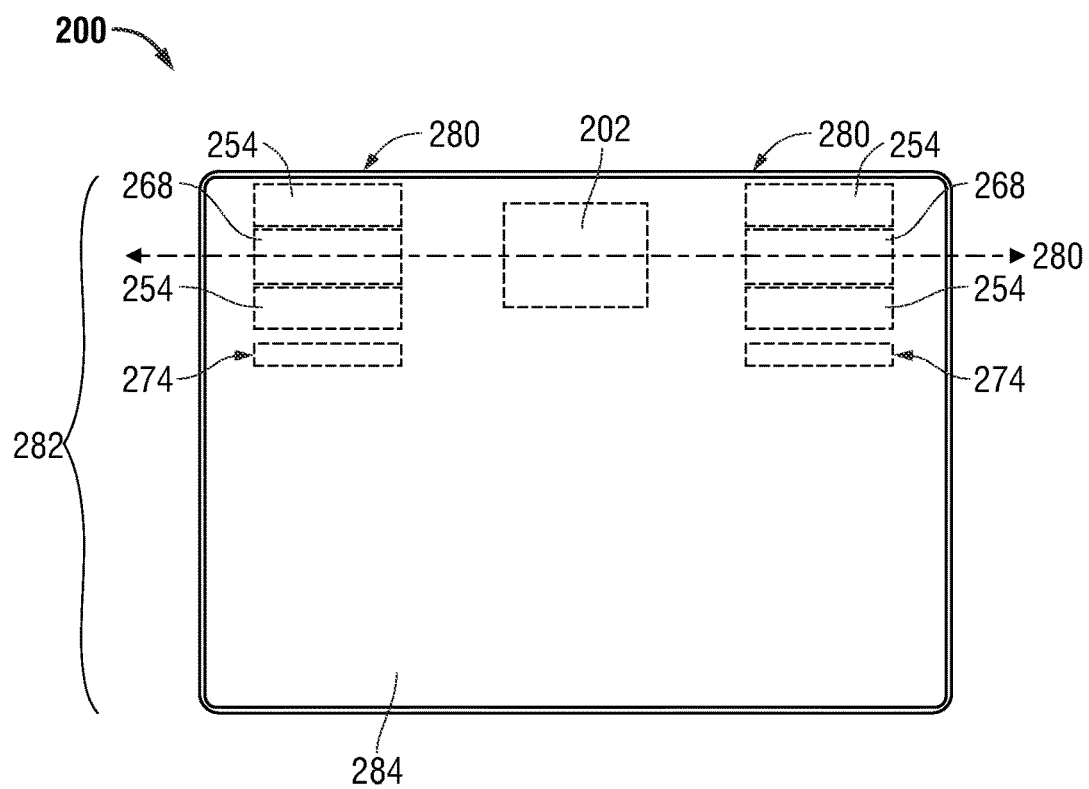
FIG. 2B is a graphic diagram front view of an information handling system housing a stacked ion emitter/collector blower cooling system including a series array of ion emitter/collector blowers according to an embodiment of the present disclosure.

FIG. 2A is a graphic diagram rear view of an information handling system 200 housing 282 a stacked ion emitter/collector blower cooling system including a series array of ion emitter/collector blowers according to an embodiment of the present disclosure. Additionally, FIG. 2B is a graphic diagram front view of an information handling system housing 282 a stacked ion emitter/collector blower cooling system including a series array of ion emitter/collector blowers 256, 262 according to an embodiment of the present disclosure. The information handling system 200, as shown in FIGS. 2A and 2B may be one of a tablet information handling system 200 or a two-in-one information handling system 200 or other type of mobile information handling system 200 that may operate in a vertical, near-vertical, or otherwise upright orientation in embodiments. As described herein, the information handling system 200 may include a wireless or detachable keyboard (not shown) used by the user to provide input to the information handling system 200. In an embodiment, the front cover/display 284 of the information handling system 200 may be a touch display device that also or alternatively allows the user to provide input to and receive output from the information handling system 200.

As described herein, the information handling system 200 may include a display chassis 282 that includes the back cover 286 and front cover/display 284. The back cover 286 and front cover/display 284 may be used to house a processor at the processor location 202 as well as one or more ion emitter/collector blower cooling systems at a first ion emitter/collector blower location 256 and a second ion emitter/collector blower location 262. Other hardware components such as a battery (not shown), a memory device (not shown), CPU (not shown), an embedded controller (not shown), a PMU (not shown) are also housed within the display chassis 282 of the information handling system housing 282. The front cover/display 284, as described herein, includes a front cover/display 284 that serves both to cover this hardware as well as an input and output device via the touch screen video display device as described herein. The back cover 268 may also house a camera 272 or other imaging device used by a user to capture still images or videos.

As described herein, the stacked ion emitter/collector blower cooling system may include one or more air inlet vents 274 formed vertically below the first ion emitter/collector blower location 256 and second ion emitter/collector blower location 262, respectively. These air inlet vents 274 may allow air to be drawn into the display chassis 282 via activation of the stacked ion emitter/collector blowers 256, 262 as well as a result of the air buoyancy differences between the cool air outside of the information handling system 200 and the relatively hotter air within the display chassis 282 for a stacked airflow enhanced and convection-enhanced airflow. Air may be blown out of the display chassis 282 at one or more air exhaust vents 280 having an upper exhaust vent location in the vertically oriented information handling system 200 thereby cooling the air and heat-generating components (e.g., the hardware processor) within the display chassis 282.

As shown in FIGS. 2A and 2B, the first ion emitter/collector blower location 256 is at a vertical location below a CPU centerline 288. In the present specification and in the appended claims, the term "vertical" is meant as an upward location where the top of the information handling system 200 is where the air exhaust vents 280 are formed into the housing 282 when the information handling system 200 is in a vertical, near-vertical, or otherwise upright orientation. Therefore, as in FIG. 2B, the CPU centerline 280 is closer, vertically, to the air exhaust vents 280 while the first ion emitter/collector blower location 256 is located at or below the CPU centerline 288. In the embodiment shown in FIGS. 2A and 2B, the stacked ion emitter/collector blower cooling system 254 includes two first ion emitter/collector blower location 256 located below the CPU centerline with one on a right side of the information handling system 200 and the other on the left. This is above inlet vent 274. It is appreciated that, although the present specification describes a certain number of first ion emitter/collector blowers at location 256 in series with a certain number of second ion emitter/collector blowers at location 262, more or less first ion emitter/collector blowers 256 and second ion emitter/collector blowers 262 may be used to exhaust heated air from within the housing of the information handling system 200 at exhaust vents 280.

The air inlet vents 274, in an embodiment, are placed, vertically, lower than the first ion emitter/collector blower locations 256. The placement of the hardware processor at or above the first ion emitter/collector blower locations 256 allows for the operation of the ion first ion emitter/collector blowers to take advantage of a chimney effect and remove air heated around the hardware processor. The chimney effect plus the stacked ion emitter/collector blower cooling system, in the present specification, pulls air into the housing of the information handling system via the air inlet vents 274, through both the first ion emitter/collector blower, through a sealed channel area location 268, and second ion emitter/collector blower, and out of the housing via the air exhaust vents 280 due to the effect of the stacked ion emitter/collector blowers and the differences in air buoyancy between the air inside the housing of the information handling system 200 and the air outside of the information handling system 200 in an embodiment. Because the air within the housing of the information handling system 200 is heated due to the operation of the heat-generating hardware components, cool air is pulled into the housing and accelerated through the housing via operation of the stacked ion emitter/collector blower cooling systems generating both a stacked emitter and a convection-enhanced airflow. This increases the amount of cold air drawn into and heated air passed out of the housing of the information handling system 200 via convection and the stacking of the ion emitter/collector blowers in series.

As shown in FIG. 2A, the back cover 268 may include a kickstand 290 formed thereon. This kickstand 290 may allow the user to prop up the information handling system 200 on a flat surface or a lap in order to interact with the information handling system 200. The kickstand 290 can be moved to a closed orientation for the user to interact with the information handling system 200 as a tablet configuration, for example a hand-held tablet. Still further, in an embodiment where the kickstand 290 has been deployed, the user may operatively couple a detachable keyboard to the bottom edge of the information handling system 200 allowing the user to provide input to the information handling system 200.

In an embodiment, a sealed channel area at a sealed channel area location 268 may be formed between the first ion emitter/collector blower at the first ion emitter/collector blower location 256 and second ion emitter/collector blower at a second ion emitter/collector blower location 262. This sealed channel area at the sealed channel area location 268 allows the airflow output from the first ion emitter/collector blower to be directed into the second ion emitter/collector blower so that the operation of the second ion emitter/collector blower increases the velocity of the airflow through the housing of the information handling system 200. In an embodiment, the sealed channel area at the sealed channel area location 268 may be a portion of the information handling system display housing 282 that is fluidically sealed along that portion to prevent reduction of the airflow and to maintain the stack emitter enhanced airflow through the sealed channel area. In another embodiment the sealed channel area at the sealed channel area location 268 may be fluidically coupled to and sealed with those heat-generating hardware devices within the housing in the display chassis 282 of the information handling system 200. This allows heat to be directed into the airflow between the first ion emitter/collector blower and second ion emitter/collector blower and pulled out of the housing of the information handling system 200. In an embodiment, the sealed channel area may house the heat-generating devices or passive heat conducting devices that draw heat away from the heat-generating devices and into an airflow between the first ion emitter/collector blower and second ion emitter/collector blower acting as a fluid-to-fluid heat exchanger transferring thermal energy from the passive heat conducting devices (e.g., heatpipe, vapor chamber, fin-stack, etc.) to the air within the airflow.

Figure 3:
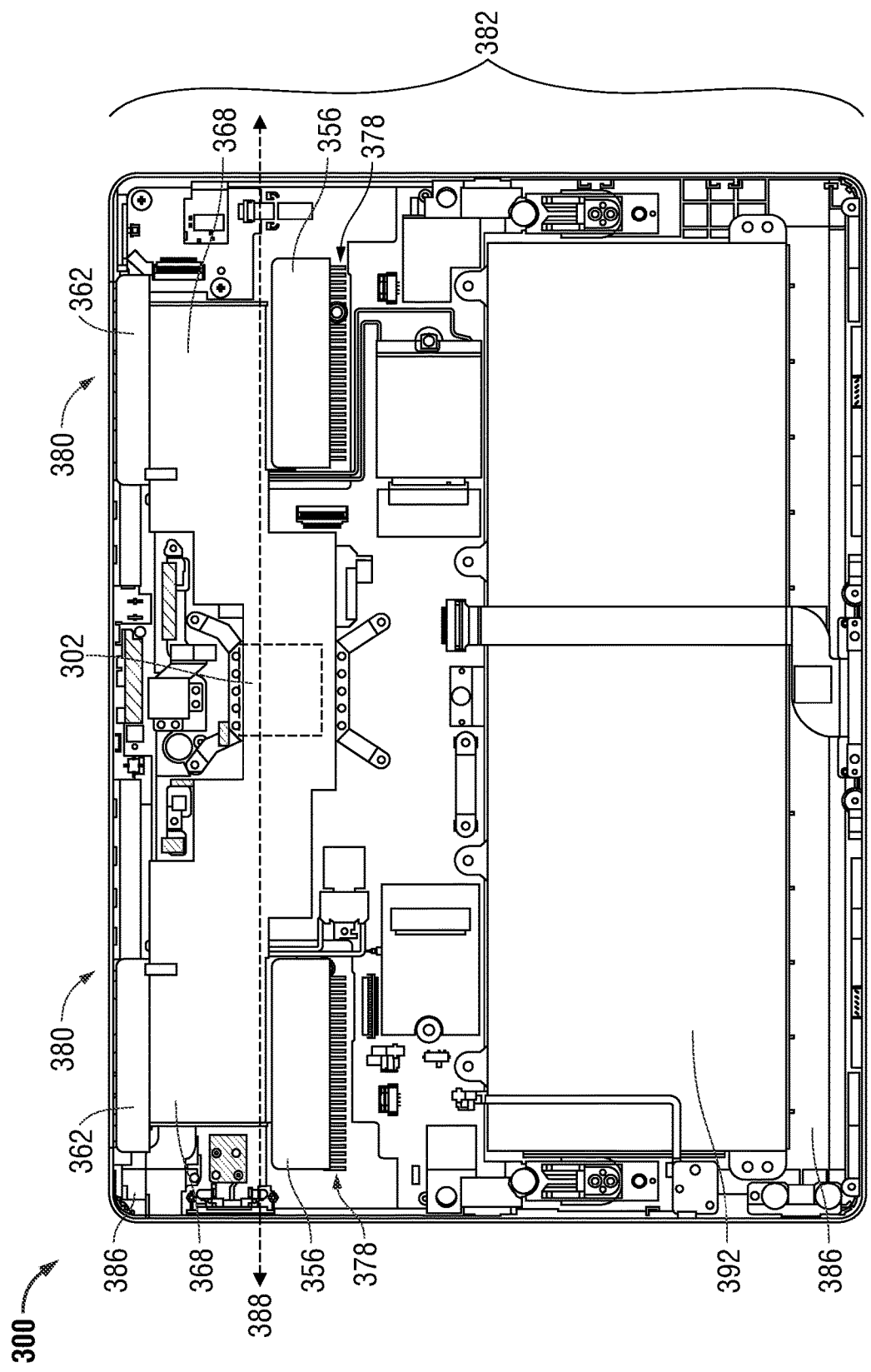
FIG. 3 is a graphic diagram top view if an interior of an information handling system back chassis including the stacked ion emitter/collector blower cooling system with its series array of ion emitter/collector blowers according to an embodiment of the present disclosure.

FIG. 3 is a graphic diagram back view if an interior of an information handling system 300 including the stacked ion emitter/collector blower cooling system with its series array of ion emitter/collector blowers 356, 362 according to an embodiment of the present disclosure. The information handling system 300 shown in FIG. 3 may be similar to the information handling system shown in FIG. 2B with the front cover or display (e.g., FIG. 2B, 284) removed allowing for the hardware components therein to be shown. Again, the orientation of the information handling system chassis 300 shows a tablet-type or two-in-one information handling system 300 in a vertical or otherwise upright orientation with a top of the information handling system 300 being closest to the top of the image and the bottom of the information handling system 300 being closest to the bottom of the image.

As described herein, the information handling system 300 may include a wireless or detachable keyboard (not shown) used by the user to provide input to the information handling system 300. In an embodiment, this keyboard may be operatively and mechanically couplable to a side wall of the tablet-type information handling system 300.

As described herein, the tablet-type or two-in-one information handling system 300 may include a display chassis 382 that includes the back cover 386 and front cover/display (not shown). The back cover 386 and front cover/display may be used to house a hardware processor at the processor location 302 as well as one or more ion emitter/collector blower cooling systems that are placed vertically below a CPU centerline 388 in tablet-type information handling system 300 that is in a vertical, near-vertical, or otherwise upright orientation. Other hardware components such as a battery 392, a memory device (not shown), a PMU (not shown) are also housed within the display chassis 382 of the tablet-type or two-in-one information handling system 300 in this vertical, near-vertical, or otherwise upright orientation. The front cover/display, as described herein, includes a front cover/display that serves both to cover this hardware as well as an input device such as the touch screen video display device as described herein. The back cover 386 may also house a camera (not shown) or other imaging device used by a user to capture still images or videos.

As described herein, the stacked ion emitter/collector blower cooling system may include one or more air inlet vents 378 formed vertically below each of the two separate first ion emitter/collector blowers 356, for example the left and right side first ion emitter/collector blowers 356, in vertically orientated information handling system 300. These air inlet vents 378 may allow air to be drawn into the display chassis 382 via activation of the first ion emitter/collector blowers 356 and the second ion emitter/collector blowers 362 in series array to generate airflow through the stacked ion emitter/collector blower systems. Further, air is also drawn in the display chassis as a result of the air buoyancy differences between the cool air outside of the information handling system 300 and the relatively hotter air within the display chassis 386 for convection-enhanced airflow. Air may be blown out of the display chassis 386 at one or more air exhaust vents 380 located at a vertically upper exhaust vent location to provide a convection-enhanced airflow thereby cooling the air and heat-generating components (e.g., the hardware processor) within the display chassis 386.

As shown in FIG. 3, the first ion emitter/collector blower 356 is at a vertical location below a CPU centerline 388. The CPU centerline 388 is closer, vertically, to the air exhaust vents 380 while the first ion emitter/collector blower 356 are located below the CPU centerline 388 since the CPU is typically a substantial heat producing hardware component. Such stacked ion emitter/collector blower systems may also be distributed about other heat-generating hardware components. In an embodiment, the CPU centerline 388 may be located through one or more sealed channel area locations 368 between the first ion emitter/collector blowers 356 and the second ion emitter/collector blowers 362 such that the emitter stacked enhanced airflow in the sealed channel area location 368 by one or more stacked ion emitter/collector blower systems may clear heater air form the heat-generating components or passive cooling systems at the CPU centerline 388.

Still further, the air inlet vents 378 are placed, vertically, lower than the first ion emitter/collector blower 356. The placement of the hardware processor at the processor location 302 above first ion emitter/collector blowers 356 allows for the operation of the first ion emitter/collector blowers 356 to take advantage of a chimney effect and further utilize convection assistance to the airflow to clear air heated around the CPU. The chimney effect, in the present specification, pulls air into the housing of the information handling system via the air inlet vents 378 and out of the housing via the air exhaust vents 380 due to the differences in air buoyancy between the air inside the housing of the information handling system 300 and the air outside of the information handling system 300. Because the air within the housing of the information handling system 300 is heated due to the operation of the heat-generating hardware components (e.g., the CPU or other hardware processors), cool air is pulled into the display chassis 382 and accelerated through the housing via operation of the first ion emitter/collector blowers 356 and second ion emitter/collector blowers 362, in series, for convection-enhanced airflow in addition to stacked emitter enhanced airflow. This increases the amount of cold air drawn into and heated air passed out of the housing of the information handling system 300 via convection and the stacked ion emitter/collector blower systems in an embodiment.

As described herein, the left and right stacked ion emitter/collector blower cooling systems shown in FIG. 3 each include one of the first ion emitter/collector blowers 356 which have a first ion emitter and first ion collector. In an embodiment, the first ion emitters include a plurality of emitter blades through which air may pass and which are used to create an airflow into, through, and out of the first ion emitter/collector blowers 356. The number of blades may vary depending on an anticipated level of heat generation by the hardware components within the information handling system 300, and the shape and design of the housing of the first ion emitter/collector blowers 356 or housing of the information handling system 300, among other factors. Each of the emitter blades are coupled to an electrode of a high voltage source of an ionic driving circuit (not shown). In an embodiment, each of the emitter blades includes a blade edge. In one embodiment, the blade edges may be made to come to a sharp point in order to facilitate the creation of more ions. In an embodiment, the first ion emitters and the emitter blades may be made of a refractory metal such as niobium, chromium, molybdenum, tantalum, tungsten, and rhenium among others. In an embodiment, the portions of the first ion emitter/collector blowers 356 and emitter blades may be electroplated with a refractory metal such as niobium, chromium, molybdenum, tantalum, tungsten, and rhenium among others with an interior layer of the first ion emitter and emitter blades being made of a conductive material such as iron. It is appreciated that the emitter blades may be made of any alloy of metal that includes alloys of those refractory metals described herein.

Additionally, the second ion emitter of the second ion emitter/collector blowers also includes a plurality of emitter blades through which air may pass and which are used to create an airflow into, through, and out of the second ion emitter/collector blower 362. It is appreciated that the second ion emitter/collector blower 362 is placed in series relative to the first ion emitter/collector blower 356 such that the airflow emitted by the first ion emitter/collector blower 356 via operation of the first ion emitter, first ion collector, and ionic driving circuit is received at the second ion emitter of the second ion emitter/collector blowers 362 and enhanced there further. This increases the airflow across the CPU centerline 388 at the sealed channel area locations 368 between the stacked first ion emitter/collector blower 356 and the second stacked ion emitter/collector blower 362. Accordingly, the second ion emitter may have similar features as those found in the first ion emitter/collector blower 356 and the first ion emitter. In an embodiment, the second ion emitter includes a plurality of emitter blades through which air may pass and which are used to create an airflow into, through, and out of second ion emitter/collector blowers 362. The number of blades may vary depending on an anticipated level of heat generation by the hardware components within the information handling system 300 and the shape and design of the housing of the second ion emitter/collector blowers 362 or housing of the information handling system 300, among other factors. Each of the emitter blades are coupled to an electrode of a high voltage source of an ionic driving circuit (not shown). In an embodiment, each of the emitter blades includes a blade edge. In one embodiment, the blade edges may be made to come to a sharp point in order to facilitate the creation of more ions. In an embodiment, the second ion emitter and the emitter blades may be made of a refractory metal such as niobium, chromium, molybdenum, tantalum, tungsten, and rhenium among others. In an embodiment, the portions of the second ion emitter/collector blowers 362 and emitter blades may be electroplated with a refractory metal such as niobium, chromium, molybdenum, tantalum, tungsten, and rhenium among others with an interior layer of the second ion emitter and emitter blades being made of a conductive material such as iron. It is appreciated that the emitter blades may be made of any alloy of metal that includes alloys of those refractory metals described herein.

The stacked ion emitter/collector blower cooling systems of FIG. 3 also include a first ion collector of each of the first ion emitter/collector blowers 356. In an embodiment, the first ion collector includes a plurality of collector blades through which air may pass and which are used to deionize those ions created at the first ion emitters as described herein. The number of collector blades may vary depending on an anticipated level of heat generation by the hardware components within the information handling system 300 and the shape and design of the housing of the first ion emitter/collector blowers 356 or the housing of the information handling system 300, among other factors such as the creation of ions at the first ion emitters. Each of the collector blades are coupled to an electrode of a high voltage source of an ionic driving circuit in an embodiment. In an embodiment, the collector blades are coupled to a grounding source used to prevent arcing between the first ion emitters and first ion collectors. In an embodiment, each of the collector blades includes a blade edge. It is appreciated that the ion collector blades may be made of any alloy of metal that includes alloys of those refractory metals described herein.

The left and right stacked ion emitter/collector blower cooling systems shown in FIG. 3 also each include a second ion collector of the second ion emitter/collector blowers 362. In an embodiment, the second ion collector includes a plurality of collector blades through which air may pass and which are used to deionize those ions created at the second ion emitter as described herein. The number of collector blades may vary depending on an anticipated level of heat generation by the hardware components within the information handling system 300 and the shape and design of the housing of the second ion emitter/collector blowers 362 or the housing of the information handling system 300, among other factors such as the creation of ions at the second ion emitter. Each of the collector blades are coupled to an electrode of a high voltage source of an ionic driving circuit in an embodiment. In an embodiment, the collector blades are coupled to a grounding source used to prevent arcing between the second ion emitter and second ion collector. In an embodiment, each of the collector blades includes a blade edge. It is appreciated that the ion collector blades may be made of any alloy of metal that includes alloys of those refractory metals described herein.

The back cover 386 may include a kickstand (not shown) formed thereon. This kickstand may allow the user to prop up the tablet-type information handling system 300 in a vertical or near-vertical orientation on a flat surface or a lap in order to interact with the information handling system 300. The kickstand can be moved to a closed orientation for the user to interact with the information handling system 300 as a hand-held tablet configuration. Still further, in an embodiment where the kickstand has been deployed, the user may operatively couple a detachable keyboard to the bottom edge of the information handling system 300 allowing the user to provide input to the information handling system 300. In such a laptop configuration, the air behind the information handling system 300 may be drawn into the display chassis 386, pass through the first ion emitter/collector blowers 356, sealed channel areas 368, and second ion emitter/collector blower 362 and out of the air exhaust vent 380 with convection-enhanced airflow.

In an embodiment, a sealed channel area location 368 may be formed between the first ion emitter/collector blowers 356 and second ion emitter/collector blowers 362. This sealed channel area location 368 allows the airflow output from the first ion emitter/collector blowers 356 to be directed into the second ion emitter/collector blowers 362 so that the operation of the second ion emitter/collector blowers 362 increases the velocity of the airflow through the housing of the information handling system 300. This stacked emitter enhanced airflow increases airflow, especially in the sealed channel area location 368 relative to a single ion emitter/collector blower. In an embodiment, the sealed channel area 368 may be a sealed portion of the display chassis 386 and the display panel (not shown) such that it is fluidically sealed with those heat-generating hardware devices and any related passive cooling structures within the housing of the information handling system 300. This allows heat to be directed into the airflow between the first ion emitter/collector blowers 356 and second ion emitter/collector blowers 362 and pulled out of the housing of the information handling system 300 from heat generating hardware devices, especially at CPU centerline 388 or wherever else a sealed channel area 368 may be located in the housing information handling system 300. In an embodiment, the sealed channel area location 368 may house passive heat conducting devices that draw heat away from the heat-generating devices and into an airflow between the first ion emitter/collector blowers 356 and second ion emitter/collector blowers 362 acting as a fluid-to-fluid heat exchanger transferring thermal energy from the passive heat conducting devices (e.g., heatpipe, vapor chamber, fin-stack, etc.) to the air within the airflow.

Figure 4:
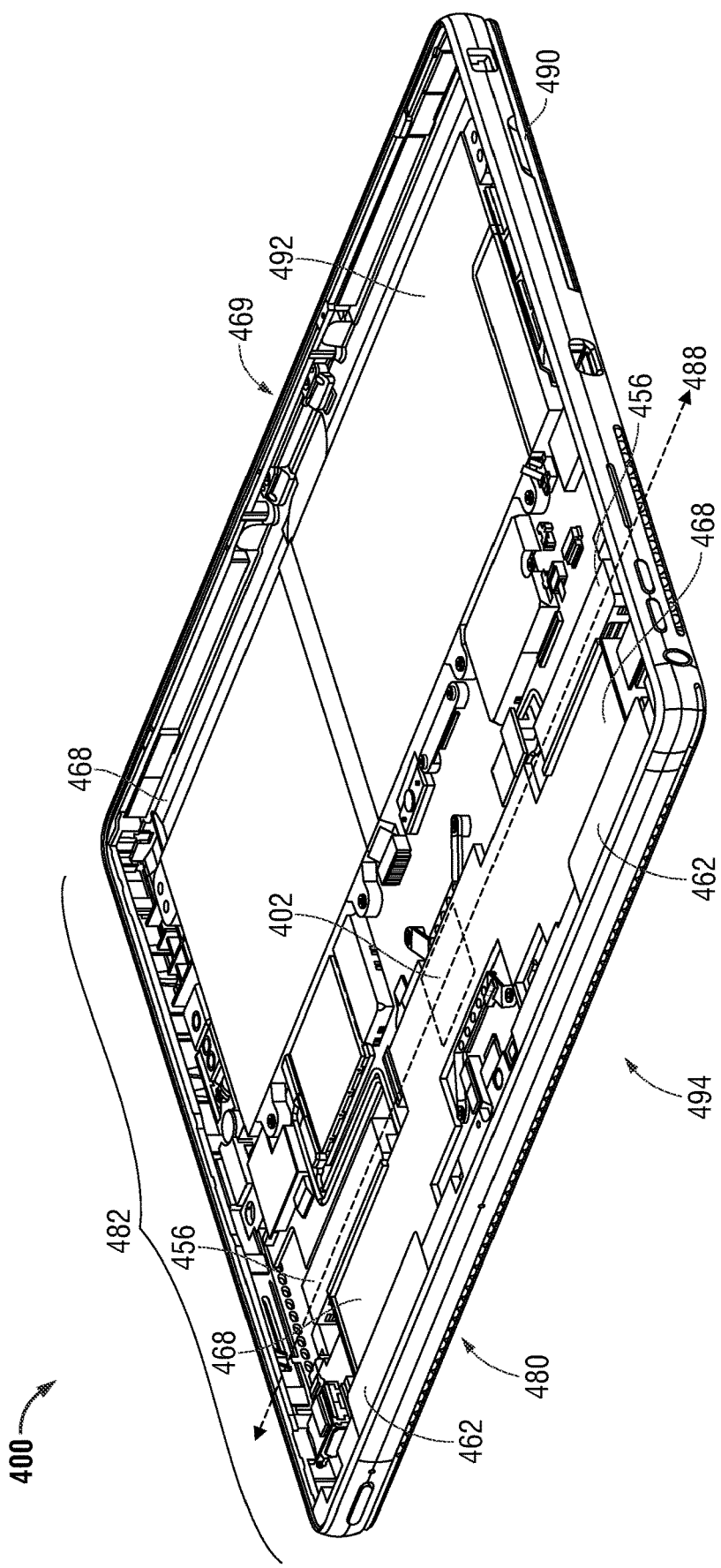
FIG. 4 is a graphic diagram perspective view if an interior of an information handling system including the stacked ion emitter/collector blower cooling system with its series array of ion emitter/collector blowers according to an embodiment of the present disclosure.

FIG. 4 is a graphic diagram perspective view of an interior of an information handling system 400 including the stacked ion emitter/collector blower cooling system according to an embodiment of the present disclosure. The information handling system 400 shown in FIG. 4 may be similar to the information handling system shown in FIG. 2B with the front cover/display (e.g., FIG. 2B, 284) removed allowing for the hardware components therein to be shown. The orientation of the information handling system 400 shows a perspective view of the information handling system 400 with the top of the information handling system 400 and the air exhaust vents 480 being shown toward the front edge 494 as shown in the image in FIG. 4.

As described herein, the information handling system 400 may include a wireless or detachable keyboard (not shown) used by the user to provide input to the information handling system 400. In an embodiment, this keyboard may be operatively and mechanically couplable to the bottom of the information handling system 400 shown as the bottom edge 496 in FIG. 4.

As described herein, the information handling system 400 may include a display chassis 482 that includes the back cover 486 and front cover/display (not shown). The back cover 486 and front cover/display may be used to house a hardware processor at the processor location 402 as well as one or more first ion emitter/collector blowers 456 are placed vertically at or on either side of a CPU centerline 488 or other heat generating component device centerline. Other hardware components such as a battery 492, a memory device (not shown), a PMU (not shown) are also housed within the display chassis 482. The front cover/display, as described herein, includes a front cover/display that serves both to cover this hardware as well as an input device via the touch screen video display device as described herein. The back cover 486 may also house a camera (not shown) or other imaging device used by a user to capture still images or videos.

As described herein, the stacked ion emitter/collector blower cooling systems of embodiments herein may include one or more air inlet vents (not shown) formed vertically below each of the first ion emitter/collector blower 456 closer to bottom edge 469 or the bottom of the tablet-type information handling system 400 when in an upright orientation. These air inlet vents may allow air to be drawn into the display chassis 482 via activation of the first ion emitter/collector blowers 456 and second ion emitter/collector blowers 462 as well as a result of the air buoyancy differences between the cool air outside of the information handling system 400 and the relatively hotter air within the display chassis 482 around the CPU centerline 488. Air may be blown out of the display chassis 482 at one or more air exhaust vents 480 by the second emitter/collector blowers 462 at an upper exhaust vent location at the front or top edge 494 of the tablet-type information handling system 400 thereby cooling the air and heat-generating components (e.g., the hardware processor) within the display chassis 482. As shown in FIG. 4, the air exhaust vents 480 are formed along a majority of a top edge of the back cover 486 allowing the airflow created by the stacked ion emitter/collector blower cooling systems to exit along a majority of the surface area of the top edge 494 of the back cover 486, as shown at the front of FIG. 4.

Again, the placement of the hardware processor at the processor location 402 at the first ion emitter/collector blowers 456 and second ion emitter/collector blowers 462 allows for the operation of the stacked ion emitter/collector blower cooling systems to take advantage of a chimney effect to further enhance airflow to clear heated air in that location in some embodiments. This chimney effect to provide additional convection enhanced airflow to the stacked emitter enhanced airflow of the first ion emitter/collector blowers 456 and second ion emitter/collector blowers 462 operates well when the information handling system 400 is in an upright orientation, but may also work in other orientations. The chimney effect, in the present specification, pulls air into the housing of the information handling system 400 via the air inlet vents and out of the housing via the air exhaust vents 480 at the upper exhaust vent location due to the differences in air buoyancy between the air inside the housing of the information handling system 400 and the air outside of the information handling system 400. Because the air within the housing of the information handling system 400 is heated due to the operation of the heat-generating hardware components (e.g., the CPU or other hardware processors), cool air is pulled into the display chassis 482 and accelerated through the housing via operation of the first ion emitter/collector blower 456 and second ion emitter/collector blower 462 with convection-enhanced airflow. This increases the amount of cold air drawn into and heated air passed out of the housing of the information handling system 400 via convection as well as with the airflow of the stacked emitter airflow by the first ion emitter/collector blowers 456 and second ion emitter/collector blowers 462.

Again, the back cover 486 may include a kickstand 490 formed thereon. This kickstand 490 may allow the user to prop up the information handling system 400 on a flat surface or a lap in order to interact with the information handling system 400 in a vertical or near-vertical orientation. The kickstand 490 can be moved to a closed orientation for the user to interact with the information handling system 400 as a hand-held tablet configuration. Still further, in an embodiment where the kickstand 490 has been deployed, the user may operatively couple a detachable keyboard to the bottom edge 469 of the information handling system 400 allowing the user to provide input to the information handling system 400. In such a laptop configuration, the air behind the information handling system 400 may be drawn into the display chassis 482, passed through the first ion emitter/collector blower 456, sealed channel area locations 468, and second ion emitter/collector blower 462, and out of the air exhaust vents 480.

In an embodiment, a sealed channel area location 468 may be formed between the first ion emitter/collector blowers 456 and second ion emitter/collector blowers 462. This sealed channel area location 468 allows the airflow output from the first ion emitter/collector blowers 456 to be directed into the second ion emitter/collector blowers 462 so that the operation of the second ion emitter/collector blowers 462 increases the velocity of the airflow through the housing of the information handling system 400. In an embodiment, the sealed channel area 468 may be a fluidically sealed portion within the information handling system housing 400 which may include those heat-generating hardware devices or passive cooling systems within the housing of the information handling system 400 so that stacked emitter airflow may cool those structures. This allows heat to be directed into the airflow between the first ion emitter/collector blowers 456 and second ion emitter/collector blowers 462 and pulled out of the housing of the information handling system 400. In an embodiment, the sealed channel area location 468 may house passive heat conducting devices that draw heat away from the heat-generating devices and into an airflow between the first ion emitter/collector blowers 456 and second ion emitter/collector blowers 462 acting as a fluid-to-fluid heat exchanger transferring thermal energy from the passive heat conducting devices (e.g., heatpipe, vapor chamber, fin-stack, etc.) to the air within the stacked emitter airflow generated by the stacked ion emitter/collector blower cooling systems.

Figure 5:
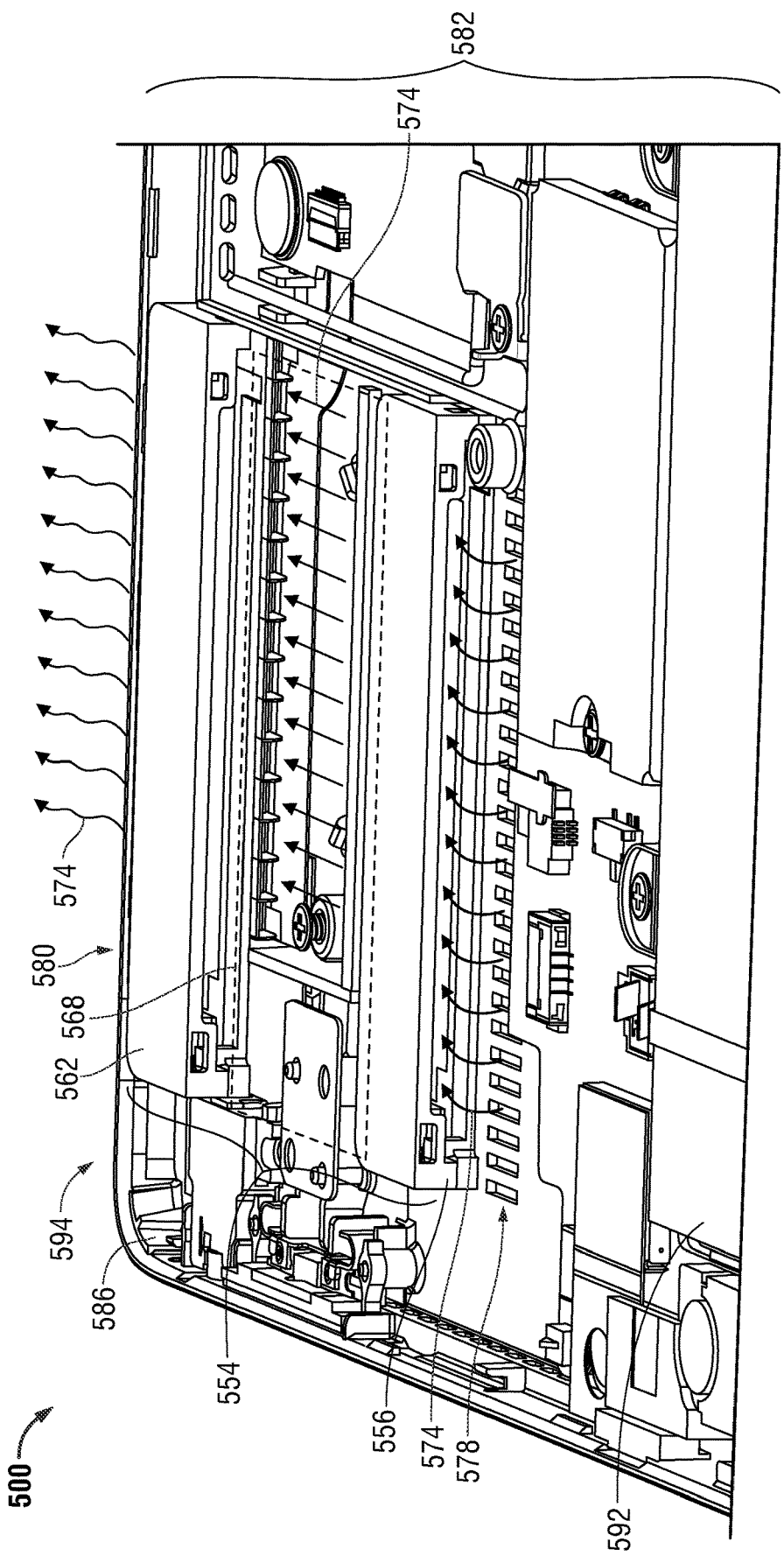
FIG. 5 is a graphic diagram partial perspective view of the stacked ion emitter/collector cooling system with series array-enhanced airflow with an interior of an information handling system chassis including an inlet vent location and an upper exhaust vent location relative to a series array of ion emitter/collector blowers according to another embodiment of the present disclosure.

FIG. 5 is a graphic diagram front view of an interior of an information handling system 500 including the stacked ion emitter/collector blower cooling system 554 according to another embodiment of the present disclosure. The information handling system 500 shows a closer view of a stacked ion emitter/collector blower cooling system 554 relative to an air exhaust vent 576 and air inlet vent 574. It is appreciation that any number of stacked ion emitter/collector blower cooling systems 554 may be incorporated into the housing of the information handling system 500 and the present specification contemplates that more than two first ion emitter/collector blowers 556 and second ion emitter/collector blowers 562 may be placed within the display chassis 582.

The back cover 586 and front cover/display (not shown) may be used to house a hardware processor as well as the first ion emitter/collector blowers 556 that are placed vertically at or below a CPU centerline and the second ion emitter/collector blower 562 that are placed above the CPU centerline and below the exhaust vent 580 as described herein. Other hardware components such as a battery 592, a memory device (not shown), a PMU (not shown) are also housed within the display chassis 582. The front cover/display, as described herein, includes a front cover/display that serves both to cover this hardware as well as an input device via the touch screen video display device as described herein. The back cover 586 may also house a camera (not shown) or other imaging device used by a user to capture still images or videos.

As described herein, the ion emitter/collector blower cooling systems may include one or more air inlet vents 578 formed vertically below each of the first ion emitter/collector blowers 556 in the information handling system 500. These air inlet vents 578 may allow air to be drawn into the display chassis 582 via activation of the first ion emitter/collector blowers 556 to generate airflow 574 that is further enhanced and increased by the second ion emitter/collector blowers 562 for a stacked emitter enhanced airflow in an embodiment. In further embodiments, as a result of the air buoyancy differences between the cool air outside of the information handling system 500 and the relatively hotter air within the display chassis 582 and the location of the air inlet 578 and the upper located air exhaust vents 580 when display chassis 582 is in a generally upright orientation, a chimney effect may further enhance the stacked emitter airflow 574. This creates a convection-enhanced airflow 574 in a sealed channel area location 568 between the stacked first and second ion emitter/collector blowers 556 and 562 of the stacked ion emitter/collector blower cooling system 554. Air may be blown out of the display chassis 582 at one or more air exhaust vents 580 at an upper location as described herein thereby cooling the air and heat-generating components (e.g., the hardware processor) within the display chassis 582. As shown in FIG. 5, the air exhaust vents 580 are formed along a majority of a top edge 594 of the back cover 586 allowing the airflow 574 created by the first ion emitter/collector blower 556 and second ion emitter/collector blower 562 of the stacked ion emitter/collector blower cooling system 554 to exit along a majority of the surface area of the top edge 594 of the back cover 586. As shown in FIG. 5, the airflow 574 between the air inlet vent 578 and the first ion emitter/collector blower 556 may increase in velocity as it is passed into the first ion emitter/collector blower 556 with the ions created by the ion emitter of the first ion emitter/collector blower 556 drags that airflow 574 through the first ion emitter/collector blower 556 to a first ion collector. The airflow 574, upon exiting the first ion emitter/collector blower 556 passes over or at a location such as the sealed channel area location 568 where heat from heat-generating hardware components (e.g., a processor) or passive cooling structures is accumulated. This airflow 574 may then enter into the second ion emitter/collector blower 562 and continue to increase in velocity or maintain velocity before the airflow 574 exists the display chassis 582 at the exhaust vents 580 at the top edge 594.

Again, the placement of the hardware processor at the processor location at or above the first ion emitter/collector blower 556 allows for the operation of the first ion emitter/collector blower 556 and second ion emitter/collector blower 562 to take advantage of a stacked emitter enhanced airflow as well as the chimney effect when the information handling system 500 is in a generally upright orientation. The chimney effect, in the present specification, pulls air into the housing of the information handling system 500 via the air inlet vents 578 and out of the display chassis 586 via the air exhaust vents 580 due to the differences in air buoyancy between the air inside the housing of the information handling system 500 and the air outside of the information handling system 500 for convection-enhanced airflow because of the lower location of the inlet vent 578 relative to the upper located exhaust vent 580 providing for further enhancement of airflow 574. Because the air within the display chassis 582 of the information handling system 500 is heated due to the operation of the heat-generating hardware components (e.g., the CPU or other hardware processors), cool air is pulled into the display chassis 582 and accelerated through the housing via operation of the first ion emitter/collector blower 556 and second ion emitter/collector blower 562 and may be enhanced by this chimney effect. This increases the amount of cold air drawn into and heated air passed out of the housing of the information handling system 500 by operation of the stacked ion emitter/collector blower cooling system 554 shown in FIG. 5.

Figure 6:
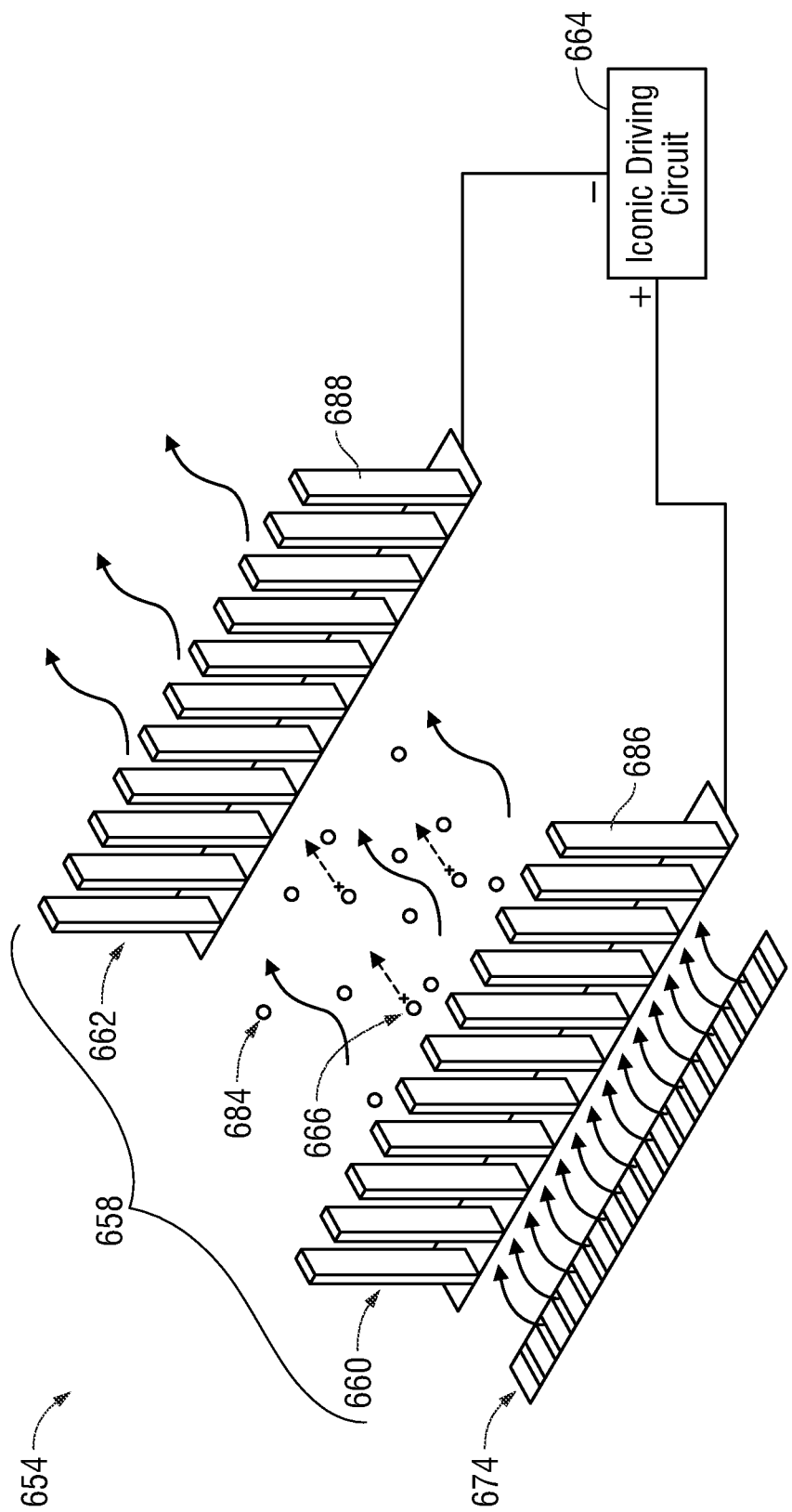
FIG. 6 is a graphic diagram perspective view of an ion emitter/collector blower that forms part of a stacked ion emitter/collector blower cooling system including an ion emitter and ion collector according to another embodiment of the present disclosure.

FIG. 6 is a graphic diagram perspective view of an ion emitter/collector blower 654 that may be part of a stacked ion emitter/collector blower cooling system according to embodiments herein. The ion emitter/collector blower 654 shown in FIG. 6 may be either the first ion emitter/collector blower cooling system or the second ion emitter/collector blower cooling system of a stacked ion emitter/collector blower cooling system. The ion emitter/collector blower 654 includes an ion emitter 660 and ion collector 662 according to another embodiment of the present disclosure. The ion emitter/collector blower 654 may be coupled within a chassis of the information handling system as part of the stacked ion emitter/collector blower cooling system according to embodiments herein so that heat generated by the operation of the hardware (e.g., hardware processor, memory devices, PMU, CPU, etc.) may be directed out of the information handling system via an air exhaust vent formed in the chassis (e.g., at a top side surface of the base chassis of the information handling system). As described herein, the arrangement of the ion emitter/collector blower 654 shown in FIG. 6 may be the arrangement of any of the first ion emitter/collector blower and second ion emitter/collector blower described herein. As such, the first ion emitter/collector blower may be placed in series with the second ion emitter/collector blower so that the velocity of the airflow may be increased as it passes out through the first ion collector of the first ion emitter/collector blower and into the second ion emitter of the second ion emitter/collector blower. Each ion emitter/collector blower 654 may include an ion emitter/collector blower housing used to house the components of the ion emitter/collector blower 654 described herein in an embodiment. In an alternative embodiment, either or both ion emitter/collector blower 654 may not include an ion emitter/collector blower housing and instead, those components of the first or second ion emitter/collector blower 654 are operatively coupled to the chassis of the information handling system.

The ion emitter/collector blower 654 of FIG. 6 includes an ion emitter 660. In an embodiment, the ion emitter 660 includes a plurality of emitter blades 686 through which air may pass and which are used to create an airflow into, through, and out of the ion emitter/collector blower housing. The number of emitter blades 686 may vary depending on an anticipated level of heat generation by the hardware components within the information handling system, or the shape and design of the ion emitter/collector blower housing or chassis of the information handling system, among other factors. Each of the emitter blades 686 are coupled to an electrode of a high voltage source of an ionic driving circuit 664. In an embodiment, each of the emitter blades 686 includes a blade edge. In one embodiment, the blade edges may be made to come to a sharp point in order to facilitate the creation of more ions. In an embodiment, the ion emitter 660 of the ion emitter/collector blower system 654 and the emitter blades may be made of a refractory metal such as niobium, chromium, molybdenum, tantalum, tungsten, and rhenium among others. In an embodiment, the portions of the first or second ion emitter/collector blower 654 of a stacked ion/emitter collector blower cooling system and emitter blades 686 may be electroplated with a refractory metal such as niobium, chromium, molybdenum, tantalum, tungsten, and rhenium among others with an interior layer of the ion emitter/collector blower 654 and emitter blades 686 being made of a conductive material such as iron. It is appreciated that the emitter blades 686 may be made of any alloy of metal that includes alloys of those refractory metals described herein.

The ion emitter/collector blower 654 of FIG. 6 also includes an ion collector 662 with a distance 658 between the ion emitter 660 and ion collector 662 across which ions 666 may generate airflow 682. In an embodiment, the ion collector 662 includes a plurality of collector blades 688 through which air may pass and which are used to deionize those ions 666 created at the ion emitter 660 as described herein. The number of collector blades 688 may vary depending on an anticipated level of heat generation by the hardware components within the information handling system, or the shape and design of the ion emitter/collector blower housing or housing of the information handling system, among other factors such as the creation of ions 666 at the ion emitter 660. Each of the collector blades 688 are coupled to an electrode of a high voltage source of an ionic driving circuit 664 in an embodiment. In an embodiment, the collector blades 688 are coupled to a grounding source used to prevent arcing between the ion emitter 660 and ion collector 662. In an embodiment, each of the collector blades 688 includes a blade edge. It is appreciated that the collector blades 688 may be made of any alloy of metal that includes alloys of those refractory metals described herein.

As described herein, the ion emitter 660 and its emitter blades 686 as well as the ion collector 662 and its collector blades 688 are electrically coupled to a high voltage source (e.g., 2 kV to 10 kV voltage source difference between the ion emitter 660 and the ion collector 662). In an embodiment, the ionic driving circuit 664 may include a boost converter that provides, for the high voltage source of the ionic driving circuit 664, those voltages described herein to the ion emitter 660 and ion collector 662. An electric field is created across the distance 658 between the ion emitter 660 and the ion collector 662.

As described in embodiments herein, the ion most of emitter/collector blower 654 may be operatively coupled to an ionic driving circuit 664. In an embodiment, the ionic driving circuit 664 is controlled via the processor, the PMU with a hardware controller, and embedded controller 103, or a combination thereof. The ionic driving circuit 664, in an embodiment, includes a high voltage source that is operatively coupled to the ion emitter/collector blower cooling system 654. In an embodiment, the high voltage source may include a boost converter that steps up voltage from its input (e.g., a battery or A/C power adapter) to the output at the ion emitter/collector blower cooling system 654. The high voltage source of the ionic driving circuit 664 causes the ion emitter 660 to emit ions 172 from the blade edges of each emitter blade 686. In the context of the present specification, the term "emit", or "emitter" is meant to describe an action and device that, at its edges or other surfaces, creates ions 666 and, via an electromagnetic repulsion, repels those ions 666 towards an attracting, oppositely charged source such as the ion collector 662 described herein. In an embodiment, the high voltage source of the ionic driving circuit 664 causes electrons to be ripped away from certain molecules such as gas molecules in the atmosphere thereby creating ions (e.g., positively-charged ions) at the edges or other surfaces of the emitter blades 686. This ionization process may include the removal of one or more electrons from the outer valence shells of the individual molecules within the gas such that they become positively charged (e.g., cations) in an embodiment. In an example where the interior of the ion emitter/collector blower housing includes atmospheric air, any number of types of gas molecules may be subjected to this process. For example, where the gas includes oxygen (O), the ionization of oxygen may include the removal of a single electron or two electrons from the oxygen molecule. This may lead to a $O^+$ or $O^{2+}$ ion (e.g., cation) being created by the first or second ion emitter/collector blower 654 with the ionic driving circuit 664 in an embodiment. Other gas molecules or molecules within the atmosphere within the ion emitter/collector blower housing 156 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$.

This ionization of the atmospheric gases within the ion emitter/collector blower housing helps to cause an airflow 682 within the ion emitter/collector blower housing. In an embodiment, the movement of the ions 666 from the ion emitter 660 to the ion collector 662 creates a shearing force on the air (e.g., ionized molecules 666 drag non-ionized molecules or air molecules 684) within the ion emitter/collector blower housing. This shearing force pulls the other air molecules 684 in the direction of the travel of the ions 666 created by the ion emitter fan 658 with the electric field across distance 658 towards the ion collector 662 thereby creating this airflow 682. In an embodiment, the movement of the ions 666 (shown as positive ions indicated with a "+" sign) created and emitted from the ion emitter 660 may be from the ion emitter 660 to the ion collector 662. In an example embodiment, the ion emitter 660 may be operatively coupled to a positive electrode of the high voltage source of the ionic driving circuit 664. As a result of generating the positively charged ions 666, the charged ion emitter 660 now repels those positively charged ions 666 causing the charged ions 666 to be repelled away from the ion emitter 660, following the electric field created between the ion emitter 660 and ion collector 662 across distance 658, and attracted to the ion collector 662.

In an embodiment, the ion collector 662 is operatively coupled to a negative or opposite electrode of the high voltage source of the ionic driving circuit 664. In an embodiment, the ion collector 662 is operatively coupled to a grounding source or high voltage negative source of the ionic driving circuit 664. Whether the ion collector 662 is coupled to a negative electrode of the high voltage source or to ground of the high voltage source, the voltage difference between the ion emitter 660 and ion collector 662 and distance 658 determines an electric field between the ion emitter 660 and the ion collector 662. The ions 666 created by the ion emitter 660 follow this electric field. In an embodiment where the ion collector 662 is operatively coupled to a negative electrode of the high voltage source and not ground, the ion collector 662 may be electrically insulated from the remaining portions of the ion emitter/collector blower 654 including the ion emitter/collector blower housing. In an embodiment, this electrical isolation may be accomplished by making the ion emitter/collector blower housing out of an electrically non-conductive material such as plastic. In an embodiment, the electrical isolation may be accomplished by placing an insulative gasket (not shown) between the ion collector 662 and the ion emitter/collector blower housing and the ion emitter 660. The electrical isolation of the ion collector 662 allows for the electrical field between the ion emitter 660 and ion collector 662 to be formed allowing for an electrical field path for the ions 666 to follow.

In an embodiment, the creation of the electric field between the ion emitter 660 and ion collector 662 causes the positively-charged ions 666 created by the ion emitter 660 to be attracted to the negatively charged ion collector 662 further causing movement of the ions 666 and creating an airflow 682 within the ion emitter/collector blower housing as described. As the positively-charged ions 666 reach the ion collector 662, those missing valence electrons stripped away by the ion emitter 660 at the ions 666 may be added to a valence shell of the ionized molecules placing those gases at a neutral electrical charge again. Following the example of the ionization of the oxygen molecules in the atmospheric gases within the ion emitter/collector blower housing by the ion emitter 660, as these $O^+$ or $O^{2+}$ ions 666 (e.g., cations) have their extraneous electrons returned from at their valence electron shells (e.g., a single electron or two electrons, respectively) the oxygen molecules are placed in an electrically neutral state.

The creation of this airflow 682 via the ionic movement of the ions 666 created by the ion emitter 660 has a low-pressure head of around 0.04 to 0.05 inches of $H_2O$ (water column) as compared to the rotation of a fan or blower that may have a pressure head of around 0.5 inches of $H_2O$. However, the flow rate of air into and out of the ion emitter/collector blower 654 via operation of the ion emitter 660 and ion collector 162 creating ions 666 is relatively higher than the potential flow rate of air created by the rotation of a fan. For purposes of the present specification, the term "pressure head" is defined as the height of a fluid (e.g., air, water or other fluids) column that corresponds to a particular pressure exerted by the fluid column corresponding to pressure or psi of airflow created by the ionization of air. By imparting relatively high airflow rate with lower pressure head, the acoustics of the ion emitter/collector blower 654 are lower than with other cooling fans or blower systems in an embodiment. As a result, in an embodiment, the stacked ion emitter/collector blower cooling system of various embodiments described herein may have a noiseless base capability of cooling the information handling system and may further implement one or more backup cooling systems via actuation of a fan motor to rotate the fan blades in some embodiments described herein. This may further increase the user satisfaction of the information handling system during operation of the information handling system by decreasing or eliminating fan noise heard by the user.

It is appreciated that a positive electrode of the high voltage source of the ionic driving circuit 664 may be operatively coupled to the collector structure 662 with the negative electrode of the high voltage source operatively coupled to the emitter structure 660 so the airflow 682 is reversed. In this example embodiment, the ion collector structure 662 of the ion emitter/collector blower 654 may strip electrons from the gas molecules creating a positively-charged ion 666 (e.g., cation) whereby the ion collector structure 662 operates, even temporarily, as an ion emitter. This allows the airflow created by the shearing force of the created ions 666 to be reversed. In an embodiment, this may be done so that any dust or debris collecting within the ion emitter/collector blower housing or the base chassis of the information handling system may be dislodged. Because the ion emitter 660 is placed vertically above an air inlet vent 674, any dust or debris collected via this reversed airflow may be passed out of the housing of the information handling system via this air inlet vent 674. The ionic driving circuit 664 may, therefore, selectively reverse the operatively connection of the electrodes to the ion emitter 660 and ion collector 662 to change the direction of airflow as described in order to perform this internal cleaning process.

Figure 7:
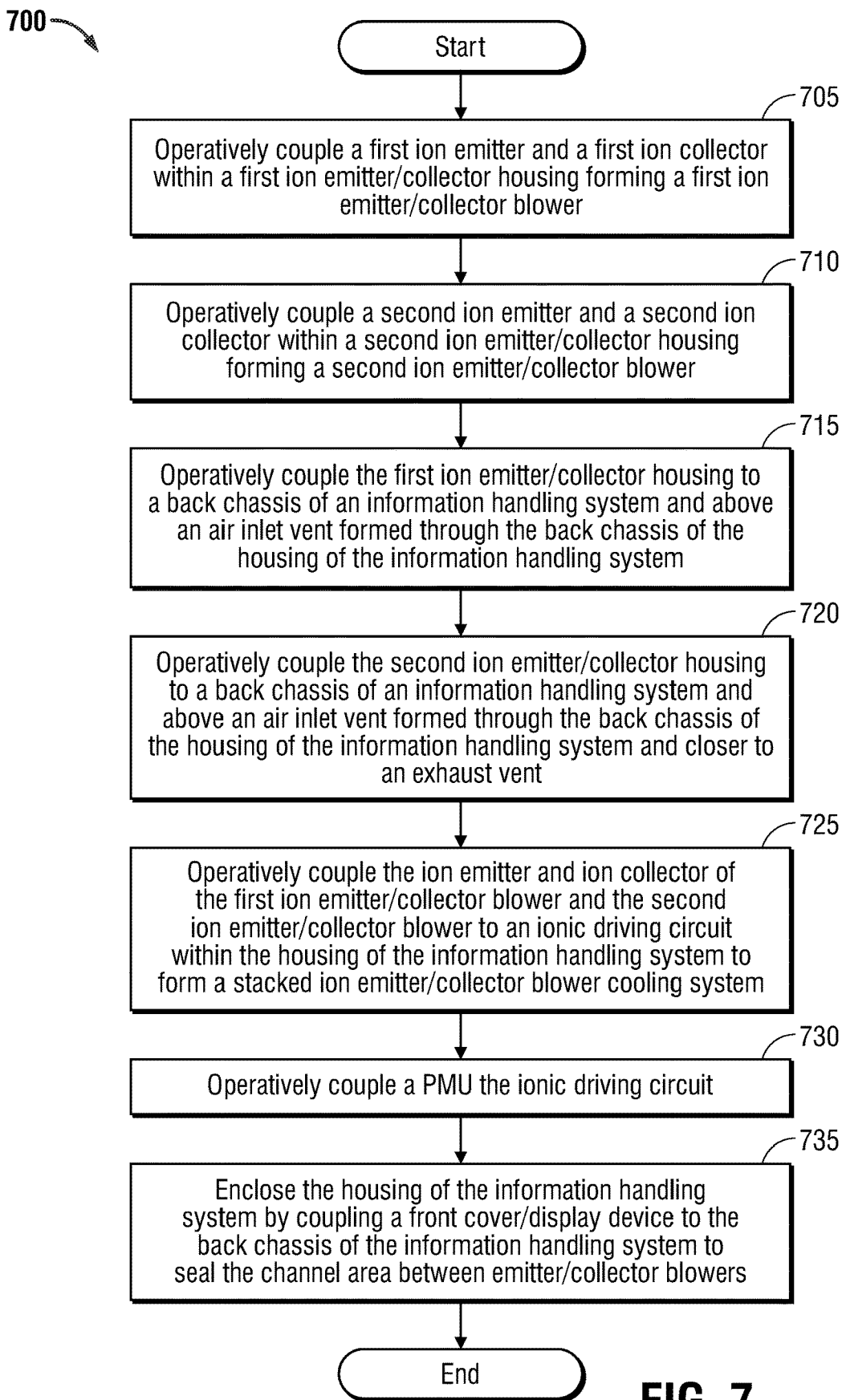
FIG. 7 is a flow diagram of a method of manufacture of an information handling system including a stacked ion emitter/collector blower cooling system with a first ion emitter/collector blower and a second ion emitter/collector blower in series according to an embodiment of the present disclosure.

FIG. 7 is a flow diagram of a method 700 of manufacture of an information handling system including a stacked ion emitter/collector blower cooling system with a first ion emitter/collector blower and a second ion emitter/collector blower in series according to an embodiment of the present disclosure. The method 700 includes, at block 705, operatively coupling a first ion emitter and a first ion collector within a first ion emitter/collector housing forming a first ion emitter/collector blower of the stacked ion emitter/collector blower cooling system. As described herein, the ion emitters described herein include a plurality of emitter blades through which air may pass and which are used to create an airflow into, through, and out of the ion emitter/collector blower housing of the first ion emitter/collector blower. The number of emitter blades may vary depending on an anticipated level of heat generation by the hardware components within the information handling system, or the shape and design of the ion emitter/collector blower housing or chassis of the information handling system, among other factors. Each of the emitter blades, as described herein, are coupled to an electrode of a high voltage source of an ionic driving circuit. In an embodiment, each of the emitter blades includes a blade edge. In one embodiment, the blade edges may be made to come to a sharp point in order to facilitate the creation of more ions. In an embodiment, the ion emitter of the ion emitter/collector blower and the emitter blades may be made of a refractory metal such as niobium, chromium, molybdenum, tantalum, tungsten, and rhenium among others. In an embodiment, the portions of the first ion emitter/collector blower and emitter blades may be electroplated with a refractory metal such as niobium, chromium, molybdenum, tantalum, tungsten, and rhenium among others with an interior layer of the stacked ion emitter/collector blower cooling system and emitter blades being made of a conductive material such as iron. It is appreciated that the emitter blades may be made of any alloy of metal that includes alloys of those refractory metals described herein.

The first ion emitter/collector blower also includes a first ion collector with a distance between the first ion emitter and first ion collector across which ions may generate airflow. In an embodiment, the first ion collector includes a plurality of collector blades through which air may pass and which are used to deionize those ions created at the ion emitter as described herein. The number of collector blades may vary depending on an anticipated level of heat generation by the hardware components within the information handling system, or the shape and design of the ion emitter/collector blower housing or housing of the information handling system, among other factors such as the creation of ions at the ion emitter. Each of the collector blades are coupled to an electrode of a high voltage source of an ionic driving circuit in an embodiment. In an embodiment, the collector blades are coupled to a grounding source used to prevent arcing between the first ion emitter and first ion collector. In an embodiment, each of the collector blades includes a blade edge. It is appreciated that the collector blades may be made of any alloy of metal that includes alloys of those refractory metals described herein.

The method 700 includes, at block 710, operatively coupling a second ion emitter and a second ion collector within a second ion emitter/collector housing forming a second ion emitter/collector blower of a stacked ion emitter/collector blower cooling system. As described herein, the ion emitters described herein include a plurality of emitter blades through which air may pass and which are used to create an airflow into, through, and out of the ion emitter/collector blower housing of the second ion emitter/collector blower. The number of emitter blades may vary depending on an anticipated level of heat generation by the hardware components within the information handling system, or the shape and design of the ion emitter/collector blower housing or chassis of the information handling system, among other factors. Each of the emitter blades, as described herein, are coupled to an electrode of a high voltage source of an ionic driving circuit. In an embodiment, each of the emitter blades includes a blade edge. In one embodiment, the blade edges may be made to come to a sharp point in order to facilitate the creation of more ions. In an embodiment, the ion emitter of the ion emitter/collector blower system and the emitter blades may be made of a refractory metal such as niobium, chromium, molybdenum, tantalum, tungsten, and rhenium among others. In an embodiment, the portions of the second ion emitter/collector blower and emitter blades may be electroplated with a refractory metal such as niobium, chromium, molybdenum, tantalum, tungsten, and rhenium among others with an interior layer of the second ion emitter/collector blower and emitter blades being made of a conductive material such as iron. It is appreciated that the emitter blades may be made of any alloy of metal that includes alloys of those refractory metals described herein.

The second ion emitter/collector blower of the stacked ion emitter/collector blower cooling system also includes a second ion collector with a distance between the second ion emitter and second ion collector across which ions may generate airflow. In an embodiment, the second ion collector includes a plurality of collector blades through which air may pass and which are used to deionize those ions created at the ion emitter as described herein. The number of collector blades may vary depending on an anticipated level of heat generation by the hardware components within the information handling system, or the shape and design of the ion emitter/collector blower housing or housing of the information handling system, among other factors such as the creation of ions at the ion emitter. Each of the collector blades are coupled to an electrode of a high voltage source of an ionic driving circuit in an embodiment. In an embodiment, the collector blades are coupled to a grounding source used to prevent arcing between the second ion emitter and second ion collector. In an embodiment, each of the collector blades includes a blade edge. It is appreciated that the collector blades may be made of any alloy of metal that includes alloys of those refractory metals described herein.

The method 700 further includes, at block 715, operatively coupling the first ion emitter/collector blower to a back chassis of an information handling system at or below a CPU centerline and above an air inlet vent formed through the back chassis of the housing of the information handling system. The first ion emitter/collector blower may be coupled within a chassis of the information handling system in an embodiment so that heat generated by the operation of the hardware (e.g., hardware processor, memory devices, PMU, CPU, etc.) may be directed through a second ion emitter/collector blower of the stacked ion emitter/collector blower cooling system and out of the information handling system and an air exhaust vent formed in the chassis (e.g., at a top side surface of the base chassis of the information handling system).

The method 700 further includes, at block 720, operatively coupling the second ion emitter/collector blower to a back chassis of an information handling system at or above a CPU centerline and below an exhaust vent formed through the top edge of the chassis of the housing of the information handling system to form the stacked ion emitter/collector blower cooling system. The second ion emitter/collector blower may be coupled within a chassis of the information handling system in an embodiment so that heat generated by the operation of the hardware (e.g., hardware processor, memory devices, PMU, CPU, etc.) may be directed from a first ion emitter/collector blower and sealed channel area location may be passed into the second ion emitter/collector blower of the stacked ion emitter/collector blower cooling system and out of the information handling system via the air exhaust vent.

The method 700 further includes, at block 725, operatively coupling the ion emitter and ion collector of the first ion emitter/collector blower and the second ion emitter/collector blower to an ionic driving circuit within the housing of the information handling system. As descried herein, the ion emitters include a plurality of emitter blades through which air may pass and which are used to create an airflow into, through, and out of the ion emitter/collector blowers as described. Each of the emitter blades are coupled to an electrode of a high voltage source of an ionic driving circuit. In an embodiment, each of the emitter blades includes a blade edge. In one embodiment, the blade edges may be made to come to a sharp point in order to facilitate the creation of more ions. In an embodiment, the ion emitter fan and the emitter blades may be made of a refractory metal such as niobium, chromium, molybdenum, tantalum, tungsten, and rhenium among others. In an embodiment, the portions of the stacked ion emitter/collector blower cooling system and emitter blades may be electroplated with a refractory metal such as niobium, chromium, molybdenum, tantalum, tungsten, and rhenium among others with an interior layer of the ion emitter and emitter blades being made of a conductive material such as iron. It is appreciated that the emitter blades may be made of any alloy of metal that includes alloys of those refractory metals described herein.

Additionally, the ion collectors include a plurality of collector blades through which air may pass and which are used to deionize those ions created at the ion emitter as described herein. Each of the collector blades are coupled to an electrode of a high voltage source of an ionic driving circuit in an embodiment. In an embodiment, the collector blades are coupled to a grounding source used to prevent arcing between the ion emitter and ion collector. In an embodiment, each of the collector blades includes a blade edge. It is appreciated that the ion collector blades may be made of any alloy of metal that includes alloys of those refractory metals described herein.

As described herein, the ion emitter and its blades as well as the ion collector and its blades are electrically coupled to a high voltage source (e.g., 2 kV to 10 kV voltage source difference between the ion emitter and the ion collector). In an embodiment, the ionic driving circuit may include a boost converter that provides, for the high voltage source of the ionic driving circuit, those voltages described herein to the ion emitter and ion collector.

At block 730, a PMU is operatively coupled to the ionic driving circuit. The PMU may provide power to the ionic driving circuit so that the voltages necessary to create ions at the ion emitters can be provided to the ion emitters during operation of the information handling system and the stacked ion emitter/collector blower cooling system. In an embodiment, a hardware PMU controller, a hardware processor, and/or an embedded controller may be operatively coupled to the ionic driving circuit to control the levels of voltages applied to the ion emitters and ion controllers as described herein.

The method 700 includes, at block 735, enclosing the housing of the information handling system by coupling a front cover/display device to the back chassis of the information handling system. In an embodiment, the front cover/display of the information handling system may be a touch display device that also or alternatively allows the user to provide input to the information handling system. As described herein, the information handling system includes the back cover and front cover/display and may, in an example embodiment, form a tablet-type or two-in-one information handling system. In enclosing the front cover/display device to the back chassis of the information handling system over the stacked ion emitter/collector blower cooling system, a portion may be fluidically sealed between the first ion emitter/collector blower and the second ion emitter/collector blower cooling system to form a sealed channel area at or near one or more heat generating hardware components such as the CPU or GPU. In an embodiment, the back cover and front cover/display may be used to house a processor at the processor location as well as one or more ion emitter/collector blowers at a stacked ion emitter/collector blower cooling system location. Other hardware components such as a battery, a memory device, and a memory device are also housed within the housing of the tablet-type information handling system. The front cover/display, as described herein, includes a front cover/display that serves both to cover this hardware as well as an input and output device via the touch screen video display device as described herein. At this point, the method 700 may end.

The blocks of the flow diagrams of FIG. 7 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
a hardware processor, a display device, and a memory device;
a power management unit (PMU) to provide power to the processor, the display device, and the memory device;
a stacked ion emitter/collector blower cooling system including:
a first ion emitter/collector blower, the first ion emitter/collector blower including a first ion emitter and a first ion collector housed within a first ion emitter/collector blower housing, the first ion emitter/collector blower being placed at a location within a chassis of the information handling system vertically lower than the hardware processor in a chassis of the information handling system in an upright orientation;
a second ion emitter/collector blower, the second ion emitter/collector blower including a second ion emitter and a second ion collector housed within a second ion emitter/collector blower housing, the second ion emitter/collector blower being placed at a location within the chassis of the information handling system vertically higher than the hardware processor in the chassis, the first ion emitter/collector blower and second ion emitter/collector blower being in fluid communication; and
an ionic driving circuit operatively coupled to the first ion emitter and the second ion emitter via a high voltage to ionize gases within the first ion emitter/collector blower housing and second ion emitter/collector blower housing to create charged ions that generate a stacked emitter airflow along a voltage field to and through the first ion collector and the second ion collector respectively, the stacked emitter airflow to cool the chassis of the information handling system.

2. The information handling system of claim 1 further comprising:
an air inlet vent located below the first ion emitter and formed in a back surface of the chassis of the information handling system and an air exhaust vent located at an upper exhaust vent location above the second ion collector within the chassis of the information handling system so that the airflow is brought into the chassis of the information handling system via the first ion emitter/collector blower housing, through the second ion emitter/collector blower housing, and out of the air exhaust vent.

3. The information handling system of claim 1 further comprising:
the first ion collector and the second ion collector to provide a deionization sources respectively for the ionized gases formed by the first ion emitter and second ion emitter, where the first ion collector and the second ion collector include one or more separated blades through which the stacked emitter airflow may pass.

4. The information handling system of claim 2, wherein the separated blades of the first ion collector and second ion collector operate as thermal fins to dissipate heat conducted from a passive heat conducting device.

5. The information handling system of claim 1 further comprising:
the first ion emitter and the second ion emitter including a plurality of emitter blades operatively coupled to the ionic driving circuit, the ionic driving circuit including a high-voltage electrical source to strip electrons from gas molecules via the high voltage at edges of the blades of the first ion emitter and the second ion emitter.

6. The information handling system of claim 1 further comprising:
an air exhaust vent formed into a top side edge of the chassis of the information handling system.

7. The information handling system of claim 1, wherein the stacked emitter airflow through the chassis of the information handling system by the stacked ion emitter/collector blower cooling system is supplemented using a buoyancy of air heated inside of the chassis of the information handling system from a lower inlet vent location toward an upper exhaust vent location in the chassis of the information handling system when in an upright orientation.

8. The information handling system of claim 1 further comprising:
a passive heat conducting device placed between the first ion emitter/collector blower housing and the second ion emitter/collector blower housing.

9. A stacked ion emitter/collector blower cooling system for an information handling system comprising:
a first ion emitter/collector blower, the first ion emitter/collector blower including a first ion emitter and a first ion collector housed within a first ion emitter/collector blower housing, the first ion emitter/collector blower being placed at a location within a chassis of the information handling system vertically lower than a head-generating hardware component in a chassis of the information handling system;
a second ion emitter/collector blower, the second ion emitter/collector blower including a second ion emitter and a second ion collector housed within a second ion emitter/collector blower housing, the second ion emitter/collector blower being placed at a location within the chassis of the information handling system vertically higher than the head-generating hardware component in the chassis, the first ion emitter/collector blower and second ion emitter/collector blower being in fluid communication to form the stacked ion emitter/collector blower cooling system;
an ionic driving circuit operatively coupled to the first ion emitter and the second ion emitter via a high voltage to ionize gases within the first ion emitter/collector blower housing and second ion emitter/collector blower housing respectively to create charged ions that generate a stacked emitter airflow along a voltage field to and through the first ion collector and second ion collector respectively; and
an air inlet vent located below the first ion emitter in the chassis of the information handling system and an air exhaust vent located at an upper exhaust vent location above the second ion collector within the chassis of the information handling system so that the airflow is brought into the chassis of the information handling system via the first ion emitter/collector blower housing, through the second ion emitter/collector blower housing and out of the air exhaust vent.

10. The stacked ion emitter/collector blower cooling system of claim 9 further comprising:
the first ion collector and the second ion collector to provide a deionization source for the ionized gases formed respectively by the first ion emitter and second ion emitter, where the first ion collector and second ion collector including one or more separated blades through which the airflow may pass.

11. The stacked ion emitter/collector blower cooling system of claim 10, wherein the separated blades of the first ion collector and second ion collector operate as thermal fins to dissipate heat conducted from a passive heat conducting device.

12. The stacked ion emitter/collector blower cooling system of claim 9 further comprising:
the first ion emitter and the second ion emitter including a plurality of emitter blades operatively coupled to the ionic driving circuit, the ionic driving circuit including a high-voltage electrical source to strip electrons from gas molecules via the high voltage at edges of the blades of the first ion emitter and second ion emitter.

13. The stacked ion emitter/collector blower cooling system of claim 9 further comprising:
the air exhaust vent is formed into a top side edge of the chassis of the information handling system.

14. The stacked ion emitter/collector blower cooling system of claim 9 further comprising:
the air inlet vent is formed in a back surface of the chassis of the information handling system at the first ion emitter of the first ion emitter/collector blower.

15. The stacked ion emitter/collector blower cooling system of claim 9 further comprising:
a passive heat conducting device placed between the first ion emitter/collector blower and the second ion emitter/collector blower.

16. A tablet-type information handling system comprising:
an information handling system housing including a back chassis and a display chassis, the information handling system housing to house:
a hardware processor, a display device, and a memory device;
a power management unit (PMU) to provide power to the hardware processor, the display device, and the memory device;

a stacked ion emitter/collector blower cooling system including:
- a first ion emitter/collector blower, the first ion emitter/collector blower including a first ion emitter and first ion collector housed within a first ion emitter/collector blower housing;
- a second ion emitter/collector blower, the second ion emitter/collector blower including a second ion emitter and second ion collector housed within a second ion emitter/collector blower housing, the second ion emitter/collector blower being placed at a location within the chassis of the information handling system vertically higher than first ion emitter/collector blower, the first ion emitter/collector blower and second ion emitter/collector blower being in fluid communication to form the stacked ion emitter/collector blower cooling system;

an ionic driving circuit operatively coupled to the first ion emitter via a high voltage to ionize gases within the first ion emitter/collector blower housing to create charged ions that generate a first airflow along a first voltage field to and through the first ion collector;

the ionic driving circuit operatively coupled to the second ion emitter via the high voltage to ionize gases within second ion emitter/collector blower housing respectively to create charged ions that generate a second airflow along a second voltage field to and through the second ion collector, where the first airflow and the second airflow form a stacked emitter airflow; and an air inlet vent located below the first ion emitter and an air exhaust vent located above the second ion collector in a chassis of the information handing system.

17. The tablet-type information handling system of claim 16:
the first ion collector and the second ion collector to provide a deionization source for the ionized gases formed by the first ion emitter and second ion emitter respectively, the first ion collector and second ion collector including one or more separated blades through which the airflow may pass.

18. The tablet-type information handling system of claim 16:
the air inlet vent formed in a back surface of the chassis of the information handling system and an air exhaust vent located at an upper exhaust vent location above the second ion collector within the chassis of the information handling system so that the airflow is brought into the chassis of the information handling system via the first ion emitter/collector blower housing, through the second ion emitter/collector blower housing in series, and out of the air exhaust vent such that a location of the air inlet vent relative to the upper exhaust vent location of the air exhaust vent in the chassis of the information handling system in a vertical orientation provides convection-enhanced stacked emitter airflow.

19. The tablet-type information handling system of claim 16:
the hardware processor placed above the first ion emitter/collector blower and below the second ion emitter/collector blower in the chassis of the information handling system.

20. The tablet-type information handling system of claim 16:
a passive heat conducting device placed between the first ion emitter/collector blower and the second ion emitter/collector blower.

* * * * *